United States Patent
Kim et al.

(10) Patent No.: US 9,825,240 B2
(45) Date of Patent: Nov. 21, 2017

(54) ORGANIC LIGHT-EMITTING DEVICE

(71) Applicant: SAMSUNG DISPLAY CO., LTD., Yongin, Gyeonggi-Do (KR)

(72) Inventors: Myeong-Suk Kim, Yongin (KR); Hye-In Jeong, Yongin (KR); Jin-Soo Hwang, Yongin (KR); Sam-Il Kho, Yongin (KR); Seung-Gak Yang, Yongin (KR); Ja-Hyun Im, Yongin (KR); Seok-Hwan Hwang, Yongin (KR)

(73) Assignee: Samsung Display Co., Ltd., Yongin-si (KR)

(\*) Notice: Subject to any disclaimer, the term of this patent is extended or adjusted under 35 U.S.C. 154(b) by 308 days.

(21) Appl. No.: 14/644,127

(22) Filed: Mar. 10, 2015

(65) Prior Publication Data

US 2015/0364697 A1 Dec. 17, 2015

(30) Foreign Application Priority Data

Jun. 17, 2014 (KR) .................. 10-2014-0073675

(51) Int. Cl.
*H01L 51/00* (2006.01)
*H01L 51/50* (2006.01)

(52) U.S. Cl.
CPC ...... *H01L 51/0072* (2013.01); *H01L 51/0061* (2013.01); *H01L 51/0058* (2013.01);
(Continued)

(58) Field of Classification Search
None
See application file for complete search history.

(56) References Cited

U.S. PATENT DOCUMENTS 6,245,449 B1  6/2001  Tamano et al.
7,635,526 B2 * 12/2009  Stossel ............... C07F 15/0033
                                                    136/263
(Continued)

FOREIGN PATENT DOCUMENTS

EP    2 395 571 A1   12/2011
JP    2005-259472 A   9/2005
(Continued)

OTHER PUBLICATIONS

Jeon et al. "100% internal quantum efficiency and stable efficiency roll-off in phosphorescent light-emitting diodes using a high triplet energy hole transport material" Applied Physics Letters 93, 063306, 2008.*

*Primary Examiner* — Robert S Loewe
(74) *Attorney, Agent, or Firm* — Lewis Roca Rothgerber Christie LLP

(57) ABSTRACT

An organic light-emitting device includes: a first electrode; a second electrode; an emission layer between the first electrode and the second electrode; a hole transport region between the first electrode and the emission layer; and an electron transport region between the second electrode and
(Continued)

the emission layer, wherein the hole transport region includes a first compound represented by Formula 1.

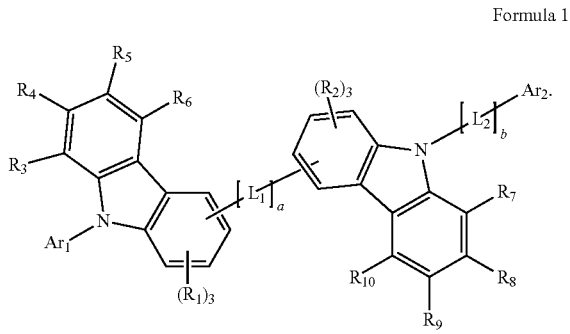

Formula 1

20 Claims, 1 Drawing Sheet

(52) U.S. Cl.
CPC ...... *H01L 51/0067* (2013.01); *H01L 51/5012* (2013.01); *H01L 51/5016* (2013.01); *H01L 51/5056* (2013.01); *H01L 2251/308* (2013.01)

(56) References Cited

U.S. PATENT DOCUMENTS

| | | | |
|---|---|---|---|
| 8,269,317 B2* | 9/2012 | Alleyne | C09K 11/06 257/347 |
| 2002/0064679 A1 | 5/2002 | Ishiskawa et al. | |
| 2006/0202194 A1* | 9/2006 | Jeong | C07F 15/0033 257/40 |
| 2006/0263635 A1* | 11/2006 | Ise | C09K 11/06 428/690 |
| 2009/0108737 A1* | 4/2009 | Kwong | H01L 51/0085 313/504 |
| 2009/0124805 A1* | 5/2009 | Alleyne | C09K 11/06 546/4 |
| 2010/0090591 A1* | 4/2010 | Alleyne | H01L 51/0085 313/504 |
| 2011/0260138 A1* | 10/2011 | Xia | C07D 405/14 257/40 |
| 2011/0279020 A1* | 11/2011 | Inoue | C07D 209/82 313/504 |
| 2012/0175599 A1 | 7/2012 | Yokoyama et al. | |
| 2012/0181518 A1* | 7/2012 | Ogiwara | H01L 51/5004 257/40 |
| 2012/0235123 A1* | 9/2012 | Lee | H01L 51/0072 257/40 |
| 2013/0092913 A1* | 4/2013 | Nishimura | C09K 11/06 257/40 |
| 2014/0151647 A1* | 6/2014 | Mizuki | H05B 33/20 257/40 |

FOREIGN PATENT DOCUMENTS

| | | |
|---|---|---|
| JP | 2006-143845 A | 6/2006 |
| KR | 10-2011-0130904 A | 12/2011 |
| KR | 10-2011-0134201 A | 12/2011 |
| KR | 10-2012-0065372 A | 6/2012 |
| KR | 10-1251451 B1 | 4/2013 |
| WO | WO 2011/152595 A1 | 12/2011 |

* cited by examiner

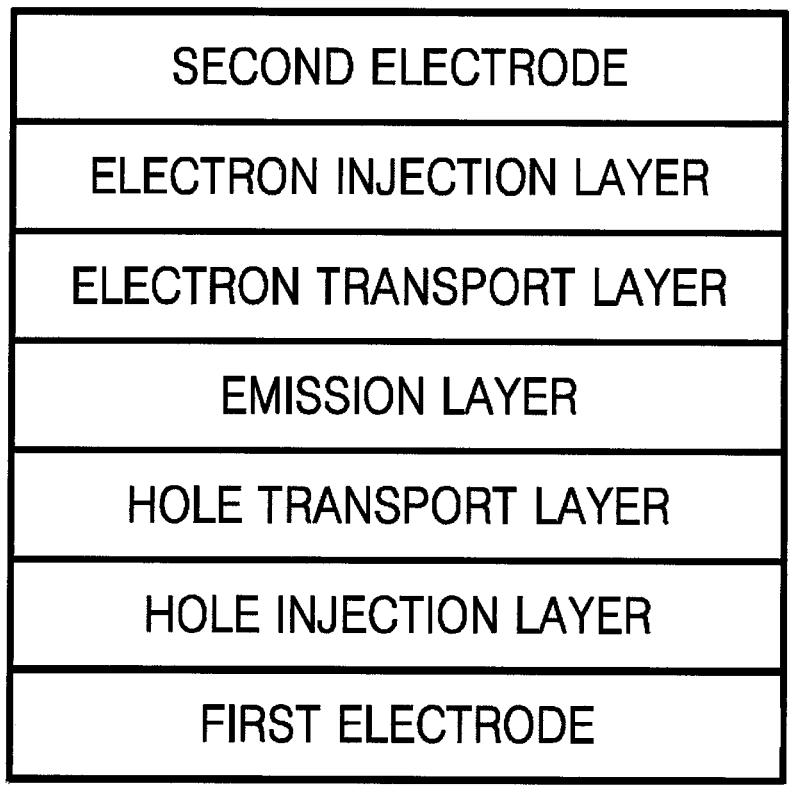

ORGANIC LIGHT-EMITTING DEVICE

CROSS-REFERENCE TO RELATED APPLICATION

This application claims priority to and the benefit of Korean Patent Application No. 10-2014-0073675, filed on Jun. 17, 2014, in the Korean Intellectual Property Office, the entire content of which is incorporated herein by reference.

BACKGROUND

1. Field

One or more aspects of embodiments of the present disclosure relate to organic light-emitting devices, and more particularly, to an organic light-emitting device that includes a hole transport region including a mixed material.

2. Description of the Related Art

Organic light-emitting devices are self-light emitting devices that emit light when voltage is applied to the device. Organic light-emitting devices provide high luminance, high contrast, multi-color reproduction, and a large viewing angle, and have quick response rate and low driving voltage.

An organic light-emitting device typically has a structure that includes an organic emission layer between an anode and a cathode. When voltage is applied to the device, holes from the anode and electrons from the cathodes are injected into the organic emission layer. The injected holes and electrons induce exchange of electrons between adjacent molecules in the organic emission layer, and then migrate towards opposite electrodes. When the electrons and holes recombine in certain molecules, molecular excitons in a high-energy excited state are generated. When the molecular excitons return to a low-energy ground state, they emit light of a certain color.

When holes and charges (e.g. electrons) injected into the organic emission layer are balanced, the organic light-emitting device may have improved efficiency and improved lifetime characteristics.

SUMMARY

One or more aspects of embodiments of the present disclosure are directed to an organic light-emitting device in which holes and charges (e.g. electrons) injected into an emission layer are balanced to improve the efficiency and lifetime characteristics of the organic light-emitting device.

Additional aspects will be set forth in part in the description which follows and, in part, will be apparent from the description, or may be learned by practice of the presented embodiments.

According to one or more embodiments of the present disclosure, an organic light-emitting device includes: a first electrode; a second electrode facing the first electrode; an emission layer between the first electrode and the second electrode; a hole transport region between the first electrode and the emission layer; and an electron transport region between the second electrode and the emission layer, wherein the hole transport region includes a first compound represented by Formula 1:

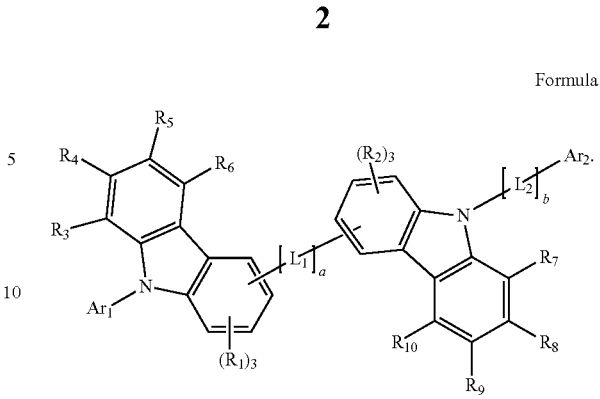

Formula 1

In Formula 1, $L_1$ and $L_2$ are each independently selected from a substituted or unsubstituted $C_6$-$C_{40}$ arylene group, or a substituted or unsubstituted $C_2$-$C_{40}$ heteroarylene group (e.g. a substituted or unsubstituted $C_5$-$C_{40}$ heteroarylene group), a and b are each independently 0 or 1, $Ar_1$ and $Ar_2$ are each independently selected from a substituted or unsubstituted $C_6$-$C_{40}$ aryl group, or a substituted or unsubstituted $C_1$-$C_{40}$ heteroaryl group (e.g. a $C_2$-$C_{40}$ heteroaryl group), a plurality of $R_1$s, a plurality of $R_2$s, and $R_3$ to $R_{10}$ are each independently selected from a hydrogen, a deuterium, a halogen atom, a hydroxyl group, a cyano group, an amino group, a substituted or unsubstituted substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{40}$ aryl group, a substituted or unsubstituted $C_2$-$C_{40}$ heteroaryl group, a substituted or unsubstituted $C_6$-$C_{40}$ aryloxy group, a substituted or unsubstituted $C_6$-$C_{40}$ arylthio group, a monovalent $C_6$-$C_{40}$ non-aromatic condensed polycyclic group, —$Si(Q_1)(Q_2)(Q_3)$, and —$B(Q_4)(Q_5)$, and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_3$-$C_{10}$ cycloalkenyl group, the substituted $C_3$-$C_{10}$ heterocycloalkyl group, the substituted $C_3$-$C_{10}$ heterocycloalkenyl group, the substituted $C_6$-$C_{40}$ aryl group, the substituted $C_1$-$C_{40}$ heteroaryl group (e.g. the substituted $C_2$-$C_{40}$ heteroaryl group), the substituted $C_6$-$C_{40}$ aryloxy group, the substituted $C_6$-$C_{40}$ arylthio group, the substituted $C_6$-$C_{40}$ arylene group, and the substituted $C_2$-$C_{40}$ heteroarylene group (e.g. the substituted $C_5$-$C_{40}$ heteroarylene group) is selected from:

a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from a deuterium, a halogen atom, a hydroxyl group, a cyano group, an amino group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{11}$) ($Q_{12}$), —Si($Q_{13}$)($Q_{14}$)($Q_{15}$), and —B($Q_{16}$)($Q_{17}$), a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_r$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, each substituted with at least one selected from a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{21}$)($Q_{22}$), —Si($Q_{23}$)($Q_{24}$)($Q_{25}$), and —B($Q_{26}$) ($Q_{27}$), and —Si($Q_{31}$)($Q_{32}$)($Q_{33}$), and —B($Q_{34}$)($Q_{35}$), where $Q_1$ to $Q_5$, $Q_{11}$ to $Q_{17}$, $Q_{21}$ to $Q_{27}$, and $Q_{31}$ to $Q_{35}$ are each independently selected from a hydrogen, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, and a monovalent $C_6$-$C_{40}$ non-aromatic condensed polycyclic group; and optionally, $R_7$ and $R_8$, $R_8$ and $R_9$, and/or $R_9$ and $R_{10}$ are each independently combined with each other to form a condensed ring.

The hole transport region may further include a second compound represented by Formula 2:

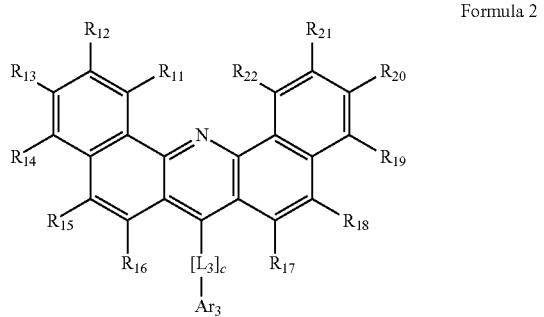

Formula 2

In Formula 2, $L_3$ is a substituted or unsubstituted $C_6$-$C_{30}$ arylene group, or a substituted or unsubstituted $C_5$-$C_{30}$ heteroarylene group;

c is 0 or 1;

$Ar_3$ is a substituted or unsubstituted $C_6$-$C_{30}$ aryl group or a substituted or unsubstituted $C_5$-$C_{30}$ heteroaryl group; and $R_{11}$ to $R_{22}$ are defined as $R_1$ to $R_{10}$ in Formula 1.

BRIEF DESCRIPTION OF THE DRAWINGS

These and/or other aspects will become apparent and more readily appreciated from the following description of the embodiments, taken in conjunction with the accompanying drawing, which is a schematic cross-sectional view of an organic light-emitting device (OLED) according to an embodiment of the present disclosure.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein; rather, these embodiments are provided so that this disclosure will be thorough, and will convey the concept of the invention to those skilled in the art. In the drawing, the thicknesses of layers and regions may be exaggerated for clarity. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

The drawing is a schematic cross-sectional view of an organic light-emitting device according to an embodiment of the present disclosure.

Referring to the drawing, the organic light-emitting device may have a stack structure in which a first electrode, a hole injection layer (HIL), a hole transport layer (HTL), an auxiliary emission layer, an emission layer (EML), an electron injection layer (EIL), and a second electrode are sequentially stacked on one another.

In the organic light-emitting device illustrated in the drawing, the first electrode may be an anode for hole injection, and the second electrode may be a cathode for electron injection.

Although not illustrated in the drawing, the organic light-emitting device may further include a substrate that may be positioned under the first electrode or above the second electrode. When the substrate is above the second electrode, the organic light-emitting device may be an inverted organic light-emitting device.

The substrate may be any substrate suitable for organic light emitting devices. In some embodiments, the substrate may be a glass substrate and/or a transparent plastic substrate. The substrate should have a strong mechanical strength, thermal stability, transparency, surface smoothness, ease of handling, and water resistance.

When the substrate is positioned under the first electrode, the first electrode may be formed by depositing or sputtering a material for forming the first electrode on the substrate. A material having a high work function may be selected as the material for the first electrode, in order to facilitate hole injection.

The first electrode may be a reflective electrode, a semi-transmissive electrode, or a transmissive electrode. When the substrate is positioned under the first electrode, and the first electrode is a reflective electrode, the organic light-emitting device of the drawing may be a top-emission organic light-emitting device. When the substrate is positioned under the first electrode, and the first electrode is a semi-transmissive electrode, the organic light-emitting device may be a bottom-emission or double-sided organic light-emitting device.

The material for the first electrode may be, for example, a transparent material having good conductivity, such as ITO, IZO, SnO$_2$, or ZnO. Non-limiting examples of the material for the first electrode also include metals such as lithium (Li), magnesium (Mg), aluminum (Al), aluminum (Al)-lithium (Li), calcium (Ca), magnesium (Mg)-indium (In), or magnesium (Mg)-silver (Ag).

The first electrode may have a single-layer structure or a multi-layer structure. For example, the first electrode may have a three-layered structure of ITO/Ag/ITO, but is not limited thereto.

The second electrode may be positioned to face the first electrode. A material for the second electrode may be, for example, a metal, an alloy, or an electrically conductive compound, that all have a low work function, or a combination thereof. Non-limiting examples of the material for the second electrode include lithium (Li), magnesium (Mg), aluminum (Al), aluminum (Al)-lithium (Li), calcium (Ca), magnesium (Mg)-indium (In), and magnesium (Mg)-silver (Ag). In some embodiments, to manufacture a top-emission organic light-emitting device, the second electrode may be a transmissive electrode formed by using (utilizing), for example, indium tin oxide (ITO) or indium zinc oxide (IZO). However, embodiments of the present disclosure are not limited thereto.

A hole transport region may be between the first electrode and the EML. In this embodiment, the organic light-emitting device may include an auxiliary emission layer in the hole transport region. The hole transport region may further include, in addition to the auxiliary emission layer, at least one of a hole injection layer (HIL), a hole transport layer (HTL), a hole injection transport layer (HITL) capable of injecting and transporting holes, a buffer layer, and an electron blocking layer (EBL). In one embodiment, the organic light-emitting device includes the HIL, the HTL, and the auxiliary emission layer, which may be stacked on the first electrode in the stated order.

The auxiliary emission layer may include a first compound represented by Formula 1.

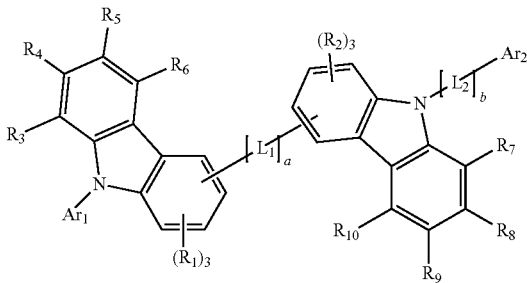

Formula 1

In Formula 1, $L_1$ and $L_2$ may be each independently a substituted or unsubstituted $C_6$-$C_{40}$ arylene group, or a substituted or unsubstituted $C_2$-$C_{40}$ heteroarylene group (e.g. a substituted or unsubstituted $C_5$-$C_{40}$ heteroarylene group);

a and b may be each independently 0 or 1;

$Ar_1$ and $Ar_2$ may be each independently a substituted or unsubstituted $C_6$-$C_{40}$ aryl group, or a substituted or unsubstituted $C_1$-$C_{40}$ heteroaryl group (e.g. a $C_2$-$C_{40}$ heteroaryl group);

a plurality of $R_1$s, a plurality of $R_2$s, and $R_3$ to $R_{10}$ may be each independently selected from a hydrogen, a deuterium, a halogen atom, a hydroxyl group, a cyano group, an amino group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{40}$ aryl group, a substituted or unsubstituted $C_2$-$C_{40}$ heteroaryl group, a substituted or unsubstituted $C_6$-$C_{40}$ aryloxy group, a substituted or unsubstituted $C_6$-$C_{40}$ arylthio group, a monovalent $C_6$-$C_{40}$ non-aromatic condensed polycyclic group, —Si($Q_1$)($Q_2$)($Q_3$), and —B($Q_4$)($Q_5$), and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_3$-$C_{10}$ cycloalkenyl group, the substituted $C_3$-$C_{10}$ heterocycloalkyl group, the substituted $C_3$-$C_{10}$ heterocycloalkenyl group, the substituted $C_6$-$C_{40}$ aryl group, the substituted $C_1$-$C_{40}$ heteroaryl group (e.g. the substituted $C_2$-$C_{40}$ heteroaryl group), the substituted $C_6$-$C_{40}$ aryloxy group, the substituted $C_6$-$C_{40}$ arylthio group, the substituted $C_6$-$C_{40}$ arylene group, and the substituted $C_2$-$C_{40}$ heteroarylene group (e.g. the substituted $C_5$-$C_{40}$ heteroarylene group) may be selected from:

a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from a deuterium, a halogen atom, a hydroxyl group, a cyano group, an amino group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, each substituted with at least one selected from a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{21}$)($Q_{22}$), —Si($Q_{23}$)($Q_{24}$)($Q_{25}$), and —B($Q_{26}$)($Q_{27}$), and —Si($Q_{31}$)($Q_{32}$)($Q_{33}$), and —B($Q_{34}$)($Q_{35}$), wherein $Q_1$ to $Q_5$, $Q_{11}$ to $Q_{17}$, $Q_{21}$ to $Q_{27}$, and $Q_{31}$ to $Q_{35}$ may be each independently selected from a hydrogen, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, and a monovalent $C_6$-$C_{40}$ non-aromatic condensed polycyclic group; and optionally, $R_7$ and $R_8$, $R_8$ and $R_9$, and/or $R_9$ and $R_{10}$ may be each independently connected with each other to form a condensed ring.

In some embodiments, $L_1$ and $L_2$ in Formula 1 may be each independently selected from a phenylene group, a pentalenylene group, an indenylene group, a naphthylene group, an azulenylene group, an indacenylene group, an acenaphthylene group, a heptalenylene group, a phenalenylene group, a fluorenylene group, a phenanthrenylene group, an anthrylene group, a fluoranthenylene group, a pyrenylene group, a naphthacenylene group, a chrysenylene group, a triphenylenylene group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, and a phenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, a triphenylenyl group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, each substituted with at least one selected from a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_5$-$C_{40}$ aryl group, a $C_2$-$C_{40}$ heteroaryl group, a $C_5$-$C_{40}$ aryloxy group, and a $C_5$-$C_{40}$ arylthio group.

In some embodiments, $L_1$ and $L_2$ in Formula 1 may be each independently selected from:

a phenylene group, a pyridylene group, a naphthylene group, and a triphenylenylene group, and a phenylene group, a pyridylene group, a naphthylene group, and a triphenylenylene group, each substituted with at least one halogen atom.

In some embodiments, $L_1$ and $L_2$ in Formula 1 may be each independently selected from groups represented by Formulae 2A to 2E.

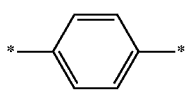

2A

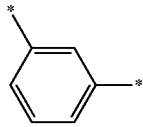

2B

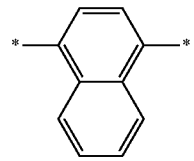

2C

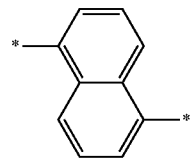

2D

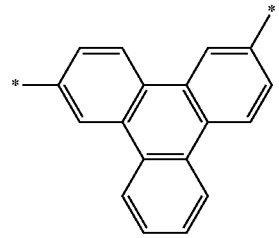

2E

In Formulae 2A to 2E, * indicates a binding site to a neighboring atom.

In some embodiments, $Ar_1$ and $Ar_2$ in Formula 1 may be each independently selected from:

a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, a benzocarbazolyl group, and a dibenzacridinyl group, and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, and a benzocarbazolyl group, each substituted with at least one selected from a deuterium, a halogen atom, a hydroxyl group, a cyano group, an amino group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_4$-$C_{30}$ heteroaryl group, a $C_5$-$C_{30}$ aryloxy group, and a $C_5$-$C_{30}$ arylthio group.

In some embodiments, $Ar_1$ and $Ar_2$ in Formula 1 may be each independently selected from:

a phenyl group, a naphthyl group, a pyridyl group, a triphenylenyl group, a phenanthrenyl group, an anthryl group, a naphthyl group, an isoquinolyl group, and a benzimidazolyl group, and a phenyl group, a naphthyl group, a pyridyl group, a triphenylenyl group, a phenanthrenyl group, an anthryl group, a naphthyl group, an isoquinolyl group, and a benzimidazolyl group, each substituted with at least one selected from a deuterium, a halogen atom, a hydroxyl group, a cyano group, an amino group, a $C_1$-$C_{10}$ alkyl group, a $C_1$-$C_{10}$ alkoxy group, a $C_6$-$C_{30}$ aryl group, a $C_4$-$C_{30}$ heteroaryl group, and a $C_6$-$C_{30}$ aryloxy group.

For example, $Ar_1$ and $Ar_2$ in Formula 1 may be each independently selected from groups represented by Formulae 3A to 3E.

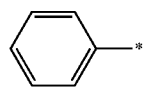

3A

3B

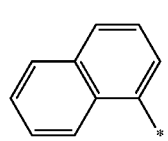

3C

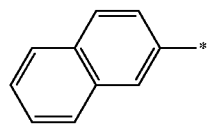

3D

-continued

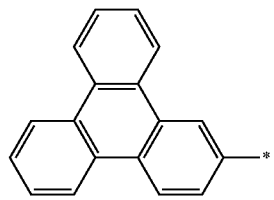

3E

In some embodiments, in Formula 1, the plurality of $R_1$s, the plurality of $R_2$s, and $R_3$ to $R_{10}$ may be each independently selected from:

a hydrogen, a deuterium, a halogen atom, a hydroxyl group, a cyano group, an amino group, a methyl group, an ethyl group, a propyl group, a butyl group, a pentyl group, a hexyl group, a cyclopropyl group, a cyclobutyl group, a cyclopentyl group, a cyclohexyl group, a cycloheptyl group, a cyclooctyl group, a phenyl group, a naphthyl group, a pentalenyl group, a pyrenyl group, an indenyl group, an azulenyl group, an anthryl group, a phenalenyl group, a phenanthrenyl group, a perylenyl group, a fluoranthenyl group, a naphthacenyl group, a fluorenyl group, a pyridyl group, a pyrimidinyl group, a quinolyl group, an isoquinolyl group, a pyrazinyl group, a pyridazinyl group, a triazinyl group, a carbazolyl group, a phenoxazinyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a dibenzofuranyl group, and a dibenzothiophenyl group, a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, each substituted with at least one selected from a deuterium, a halogen atom, a hydroxyl group, a cyano group, and an amino group; and a phenyl group, a naphthyl group, a pentalenyl group, a pyrenyl group, an indenyl group, an azulenyl group, an anthryl group, a phenalenyl group, a phenanthrenyl group, a perylenyl group, a fluoranthenyl group, a naphthacenyl group, a fluorenyl group, a pyridyl group, a pyrimidinyl group, a quinolyl group, an isoquinolyl group, a pyrazinyl group, a pyridazinyl group, a triazinyl group, a carbazolyl group, a phenoxazinyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a dibenzofuranyl group, and a dibenzothiophenyl group, each substituted with at least one selected from:

a hydrogen, a deuterium, a halogen atom, a hydroxyl group, a cyano group, an amino group, a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, and a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, each substituted with a deuterium or a halogen atom.

In some embodiments, in Formula 1, the plurality of $R_1$s, the plurality of $R_2$s, and $R_3$ to $R_{10}$ may be each independently selected from a hydrogen, a deuterium, a halogen atom, a hydroxyl group, a cyano group, an amino group, a methyl group, a phenyl group, a naphthyl group, an anthryl group, a triphenylenyl group, a pyridyl group, a quinolyl group, and an isoquinolyl group, and optionally, $R_7$ and $R_8$, $R_8$ and $R_9$, and/or $R_9$ and $R_{10}$ may be each independently linked to each other to form a condensed ring (e.g. a benzene ring).

The auxiliary emission layer may further include a second compound represented by Formula 2.

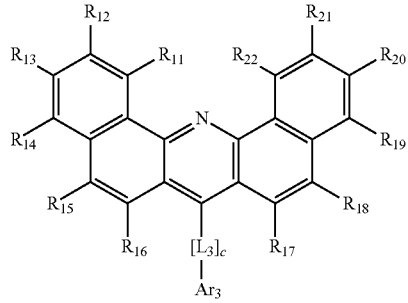

Formula 2

In Formula 2, $L_3$ may be a substituted or unsubstituted $C_6$-$C_{30}$ arylene group, or a substituted or unsubstituted $C_5$-$C_{30}$ heteroarylene group;

c may be 0 or 1;

$Ar_3$ may be a substituted or unsubstituted $C_6$-$C_{30}$ aryl group or a substituted or unsubstituted $C_5$-$C_{30}$ heteroaryl group; and $R_{11}$ to $R_{22}$ may be defined as $R_1$ to $R_{10}$ in Formula 1.

In some embodiments, in Formula 2, $L_3$ may be a phenyl group;

c may be 0 or 1;

$Ar_3$ may be selected from:

a pyridyl group, a naphthyl group, an anthryl group, a quinolyl group, an isoquinolyl group, and a benzodiazolyl group, and a pyridyl group, a quinolyl group, an isoquinolyl group, and a benzodiazolyl group, each substituted with a phenyl group or a naphthyl group; and $R_{11}$ to $R_{22}$ may be each independently a hydrogen.

In some embodiments, in Formula 2, $L_3$ may be a phenyl group;

c may be 0 or 1;

$Ar_3$ may be selected from Formulae 4A to 4F; and $R_{11}$ to $R_{22}$ may each be a hydrogen.

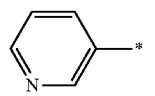

4A

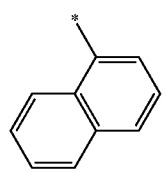

4B

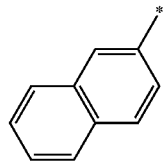

4C

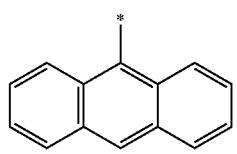

4D

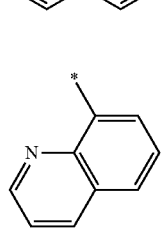

4E

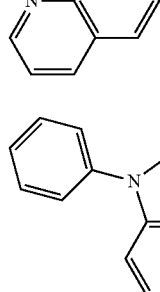

4F

In Formulae 4A to 4F, * indicates a binding site to a neighboring atom.

In some embodiments, a weight ratio of the first compound to the second compound may be about 20:80 to about 80:20. When the weight ratio of the first compound to the second compound is within this range, the auxiliary emission layer may substantially control charge balance and may improve the efficiency and lifetime characteristics of the organic light-emitting device.

In some embodiments, the first compound may be included the auxiliary emission layer of the organic light-emitting device and may be represented by one of Formulae 1A to 1C.

Formula 1A

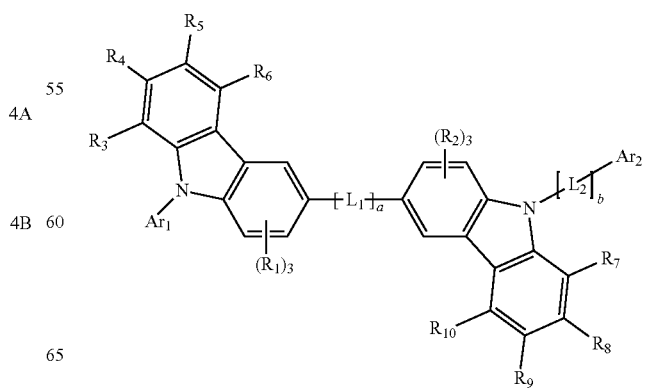

-continued

Formula 1B

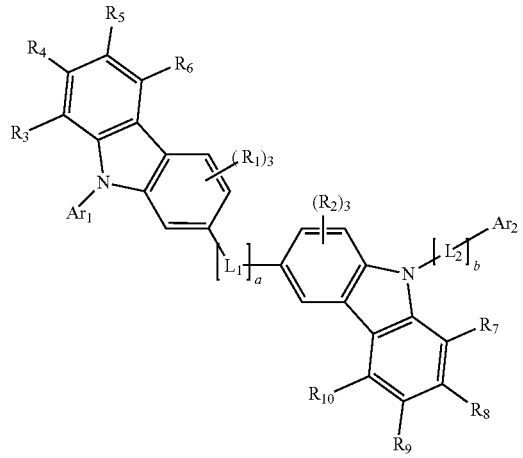

Formula 1C

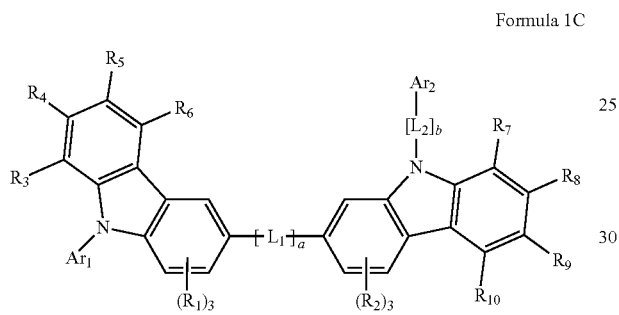

In Formulae 1A to 1C,

L$_1$ and L$_2$ may be each independently selected from a phenylene group, a pyridylene group, and a phenylene group substituted with at least one halogen atom;

Ar$_1$ and Ar$_2$ may be each independently selected from:

a phenyl group, a naphthyl group, a pyridyl group, a triphenylenyl group, a phenanthrenyl group, an anthryl group, a naphthyl group, an isoquinolyl group, and a benzimidazolyl group, and a phenyl group, a naphthyl group, a pyridyl group, a triphenylenyl group, a phenanthrenyl group, an anthryl group, a naphthyl group, an isoquinolyl group, and a benzimidazolyl group, each substituted with at least one selected from a deuterium, a halogen atom, a hydroxyl group, a cyano group, an amino group, a $C_1$-$C_{20}$ alkyl group, a $C_1$-$C_{20}$ alkoxy group, a $C_6$-$C_{40}$ aryl group, a $C_2$-$C_{40}$ heteroaryl group, and a $C_5$-$C_{40}$ aryloxy group;

a plurality of R$_1$s, a plurality of R$_2$s, and R$_3$ to R$_{10}$ may be each independently selected from a hydrogen, a deuterium, a halogen atom, a hydroxyl group, a cyano group, an amino group, a methyl group, a phenyl group, a naphthyl group, an anthryl group, a pyridyl group, a quinolyl group, and an isoquinolyl group; and optionally, R$_7$ and R$_8$, R$_8$ and R$_9$, and/or R$_9$ and R$_{10}$ may be each independently linked to each other to form a condensed ring (e.g. a benzene ring).

In some embodiments, the second compound may be included in the auxiliary emission layer, in addition to the first compound represented by any one of Formulae 1A, 1B or 1C, and the second compound may be represented by Formula 2A.

Formula 2A

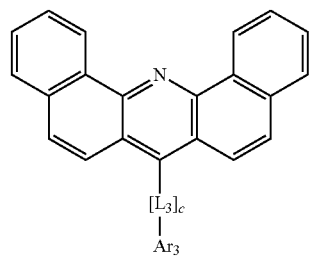

In Formula 2A,

L$_3$ may be phenyl group;

c may be 0 or 1;

Ar$_3$ may be selected from Formulae 4A to 4F; and

R$_{11}$ to R$_{22}$ may each be a hydrogen.

4A

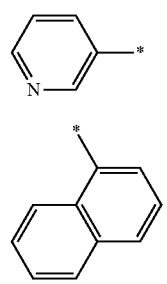

4B

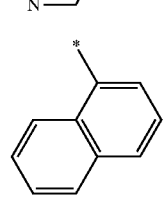

4C

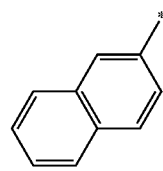

4D

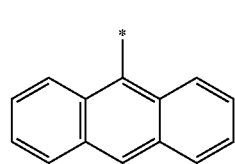

4E

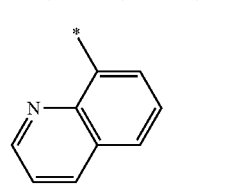

4F

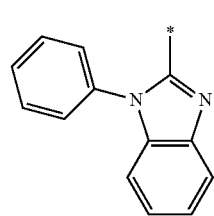

In Formulae 4A to 4F, * indicates a binding site to a neighboring atom.

In some embodiments, the first compound of Formula 1 may include at least one of Compounds 1 to 18.

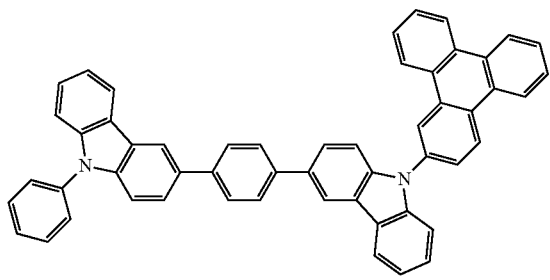
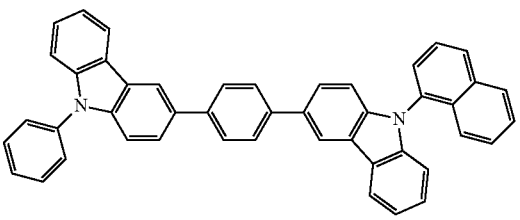
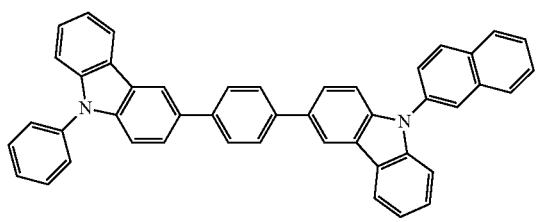
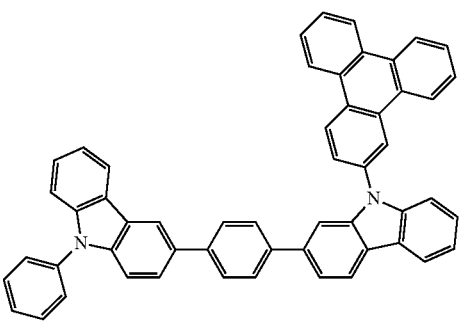
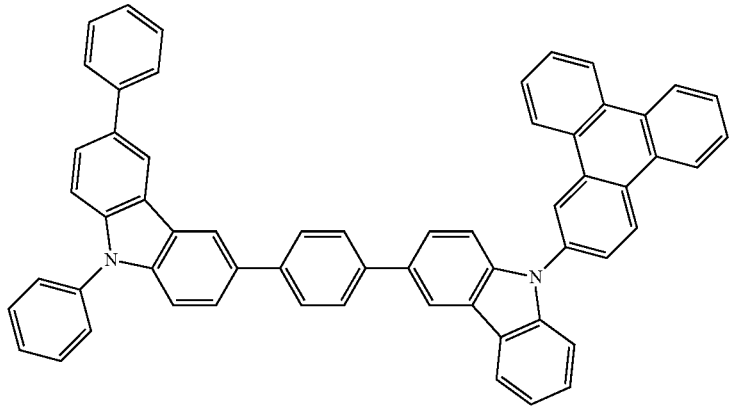
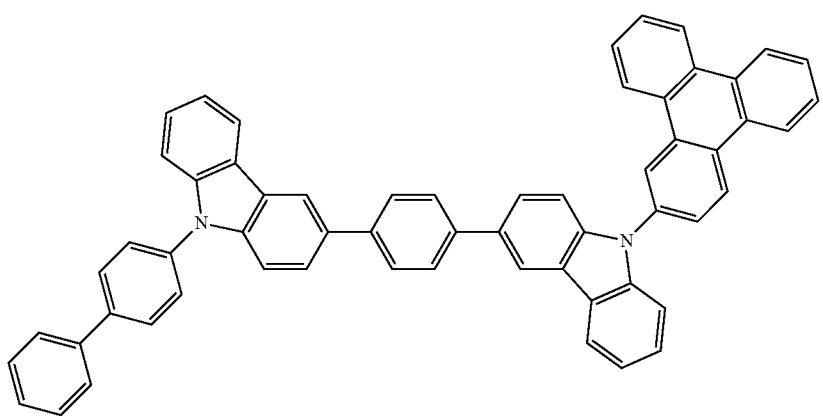

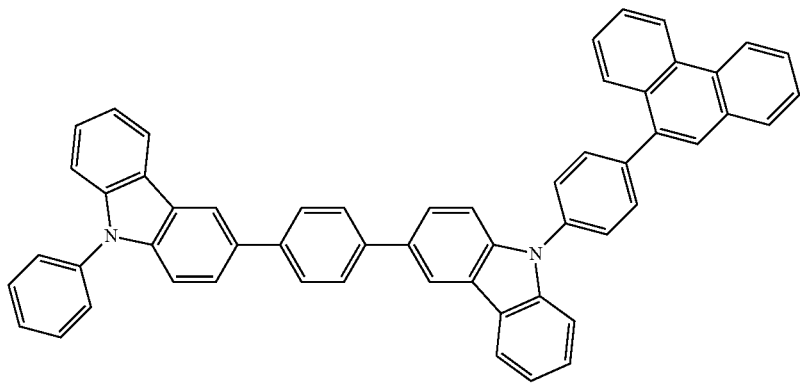
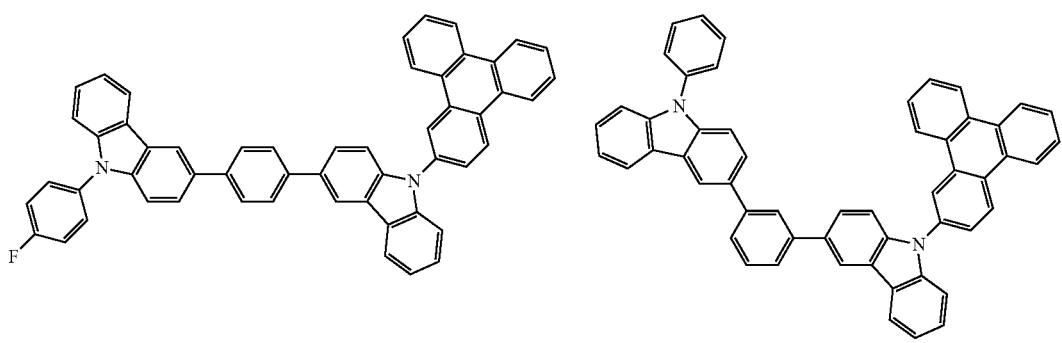
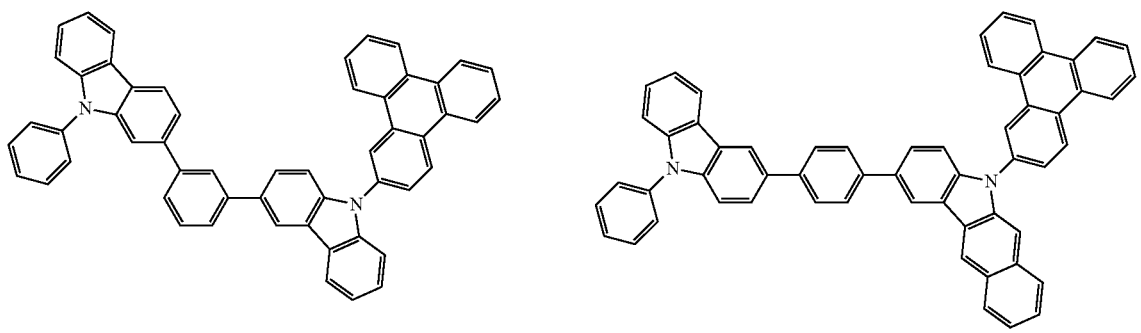

-continued
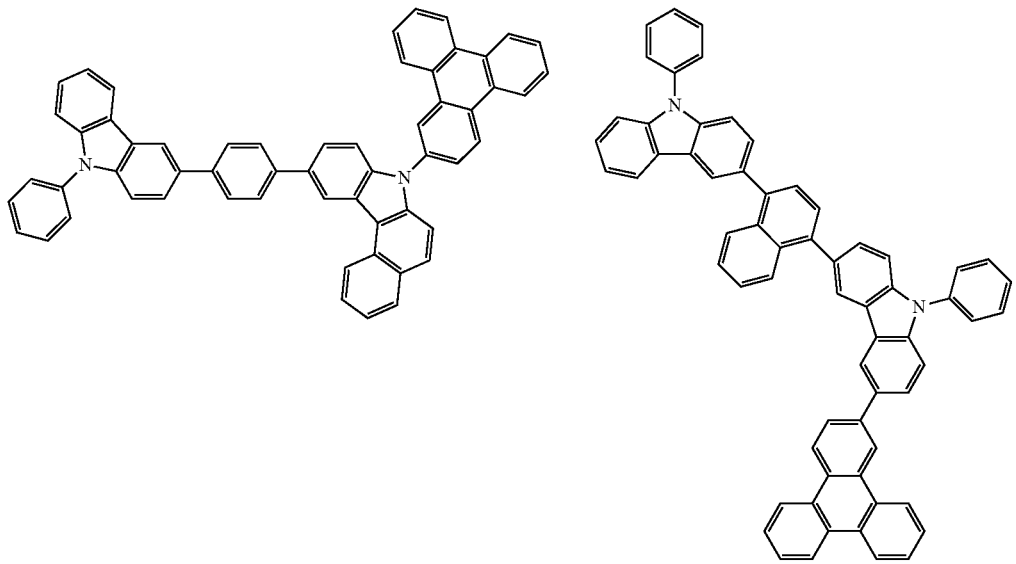
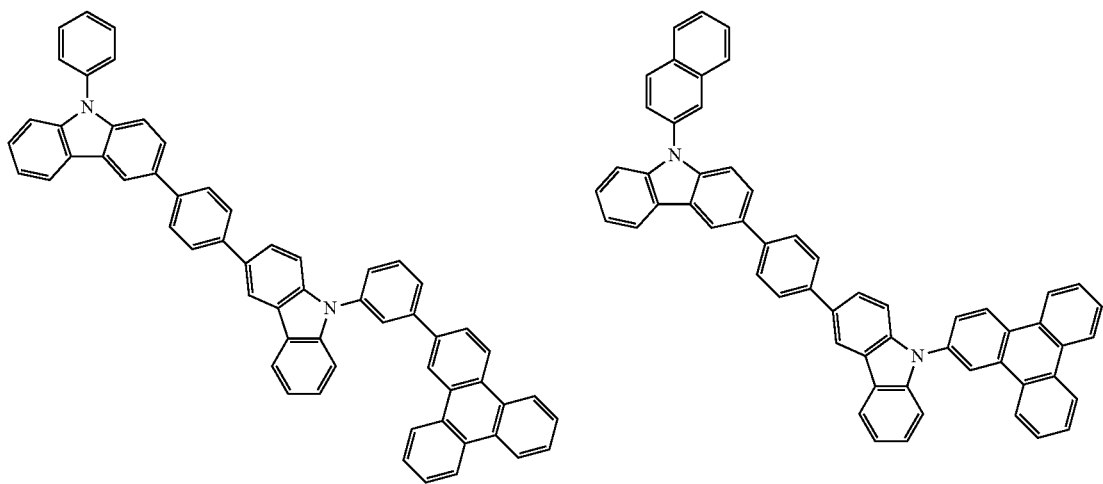
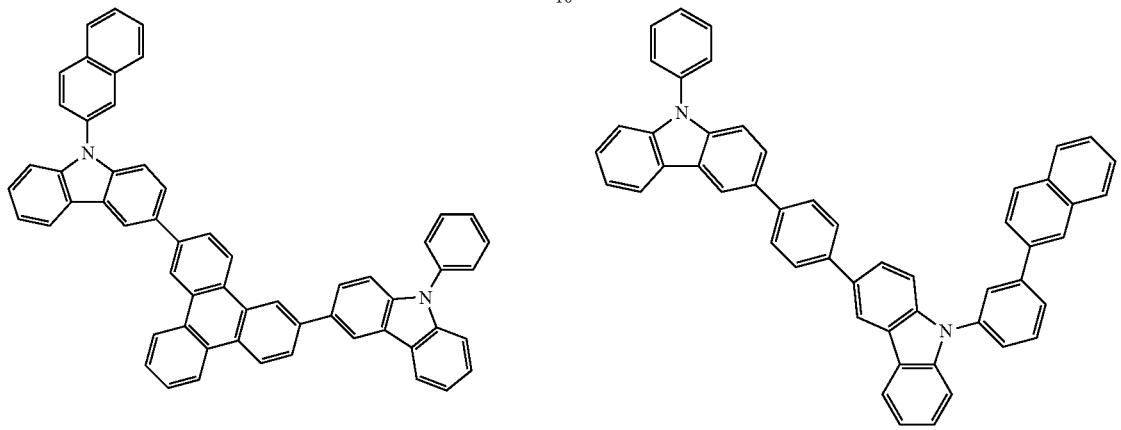

18
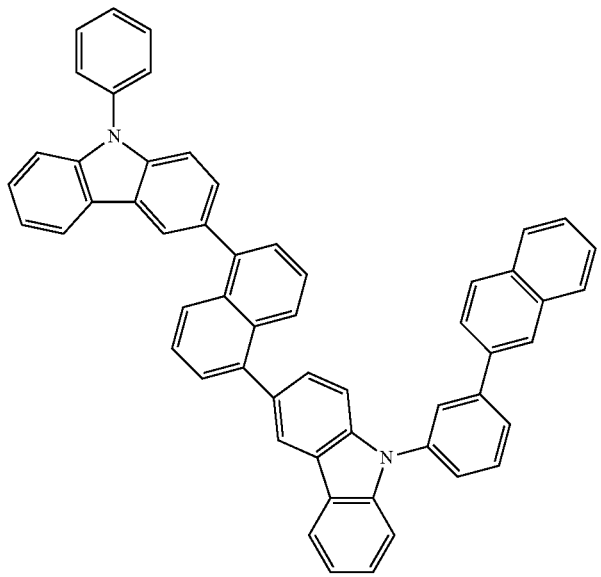
In some embodiments, the second compound of Formula 2 may include at least one of Compounds 21 to 26.
21
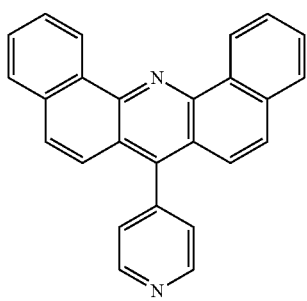
22
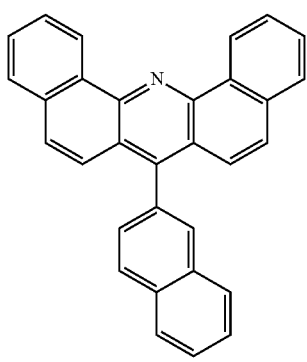
23
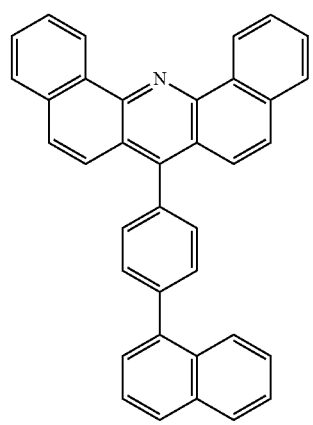
24
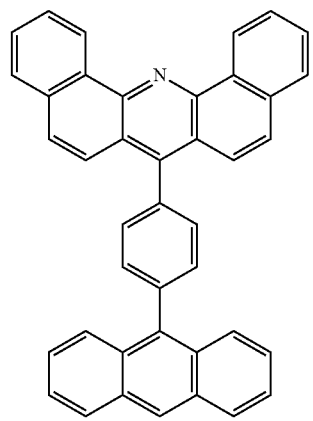

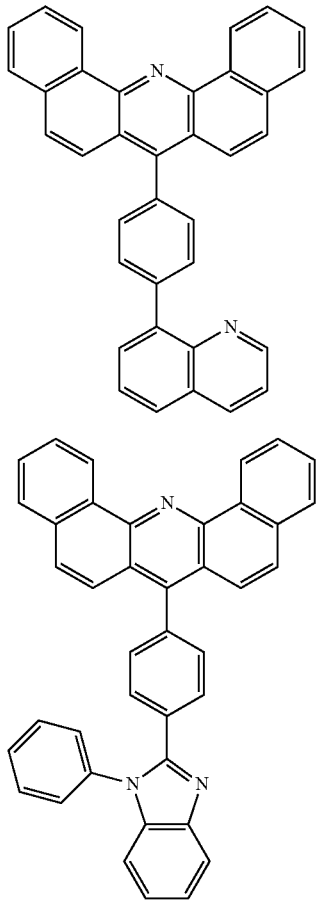

A thickness of the auxiliary emission layer may be from about 30 Å to about 300 Å, and in some embodiments, from about 50 Å to about 200 Å. When the thickness of the auxiliary emission layer is within any of these ranges, it may be possible to substantially control the balance of charges to improve the efficiency and lifetime characteristics of the organic light-emitting device.

Although in one embodiment of the present invention the auxiliary emission layer is described to be between the EML and the HTL, the location of the auxiliary emission layer is not limited thereto. The auxiliary emission layer may be in any location within the hole transport region. For example, the hole transport region may include a structure of layers sequentially stacked on the substrate, the structure including, for example, HTL/auxiliary emission layer, HTL/auxiliary emission layer/buffer layer, HTL/buffer layer/auxiliary emission layer, HIL/auxiliary emission layer/HTL, HIL/auxiliary emission layer/HTL/buffer layer, HIL/HTL/auxiliary emission layer, HIL/HTL/buffer layer/auxiliary emission layer, or HTL/auxiliary emission layer/EBL. However, the embodiments of the present disclosure may be modified in a variety of ways, and are not limited thereto. The auxiliary emission layer may be formed, for example, by vacuum deposition, or co-deposition.

When the hole transport region includes a HIL, the HIL may be formed on the first electrode by any of a variety of methods, for example, vacuum deposition, spin coating, casting, Langmuir-Blodgett (LB) deposition, inkjet printing, laser printing, laser induced thermal imaging (LITI), or the like.

When the HIL is formed by vacuum deposition, the deposition conditions may vary depending on the material for forming the HIL and the structure of the HIL to be formed. For example, the deposition conditions may be as follows: a deposition temperature of about 100° C. to about 500° C., a degree of vacuum of about $10^{-8}$ to about $10^{-3}$ Torr, and a deposition rate of about 0.01 to 100 Å/sec.

When the HIL is formed by spin coating, the coating conditions may vary depending on the material for forming the HIL and the structure of the HIL to be formed. For example, the coating conditions may be as follows: a coating rate of about 2,000 rpm to about 5,000 rpm and a heat treatment temperature of about 80° C. to about 200° C.

When the hole transport region includes a HTL, the HTL may be formed on the first electrode or on the HIL by any of a variety of methods, for example, vacuum deposition, spin coating, casting, Langmuir-Blodgett (LB) deposition, inkjet printing, laser printing, laser induced thermal imaging (LITI), or the like. When the HTL is formed by vacuum deposition or spin coating, the deposition and coating conditions may be similar to the above-described deposition and coating conditions for forming the HIL, and accordingly will not be described in more detail.

In some embodiments, the HIL and/or the HTL may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201, and a compound represented by Formula 202.

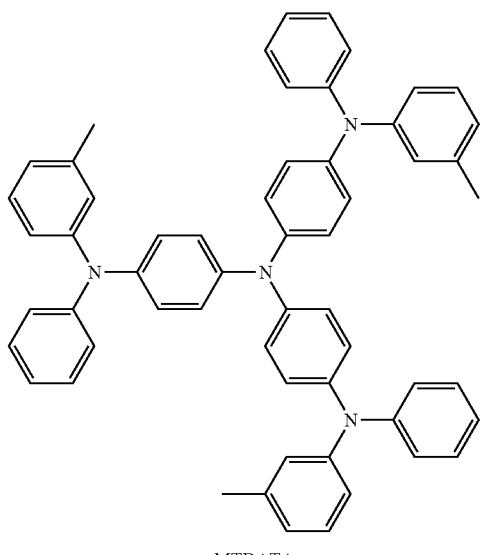

m-MTDATA

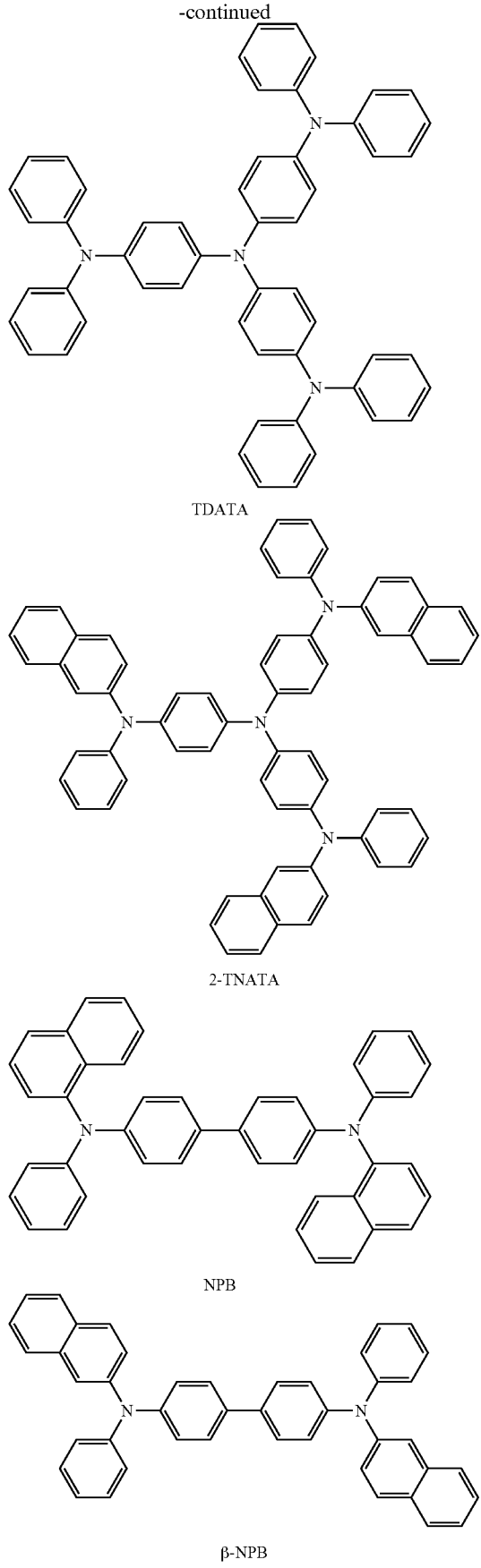
TDATA
2-TNATA
NPB
β-NPB
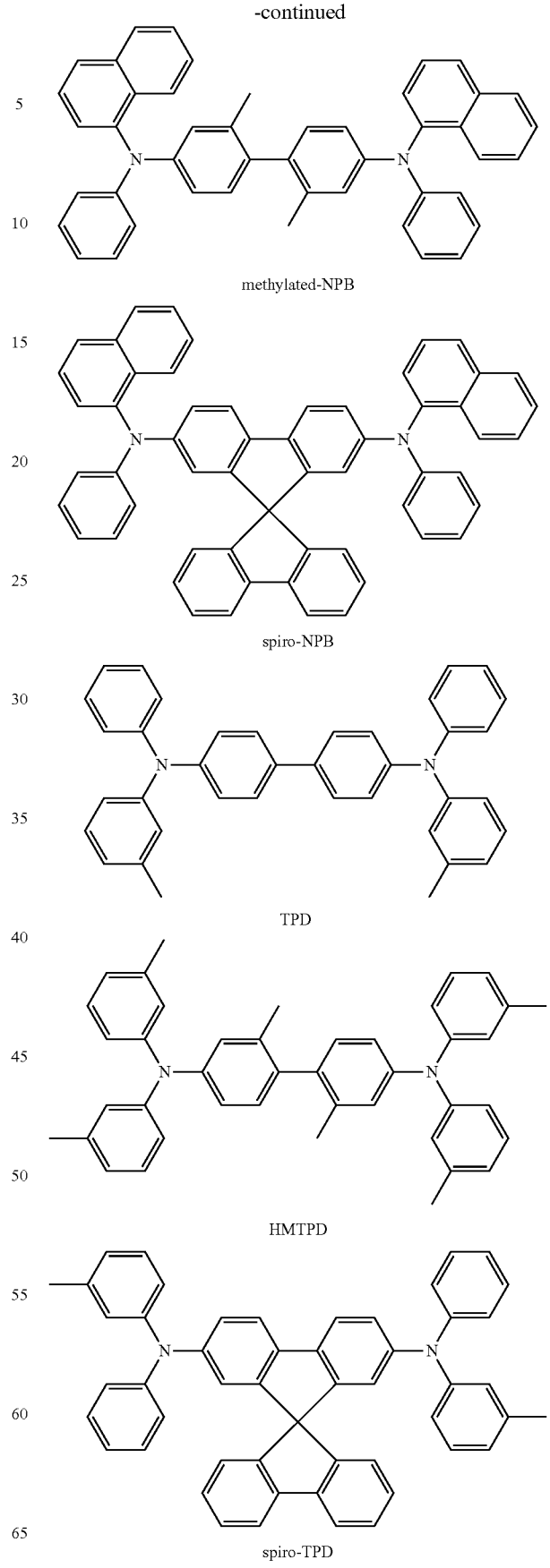
methylated-NPB
spiro-NPB
TPD
HMTPD
spiro-TPD -continued

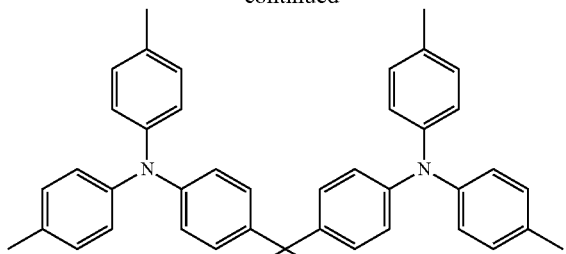

TAPC

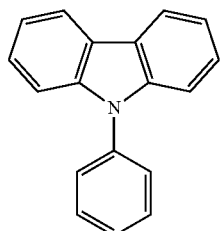

TCTA

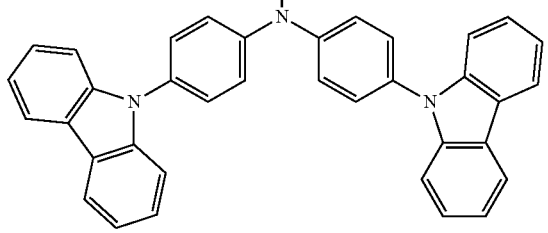

PEDOT/PSS

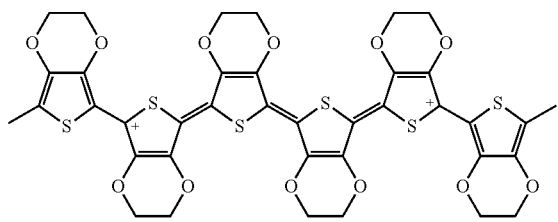

PANI/DBSA

-continued

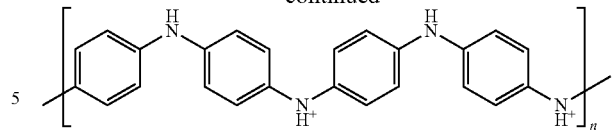

PANI/CSA

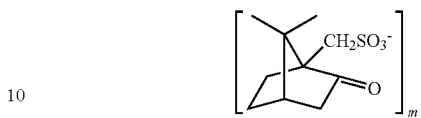

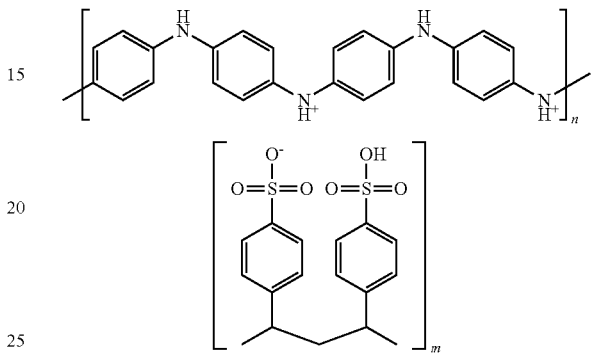

PANI/PSS

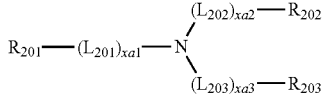

Formula 201

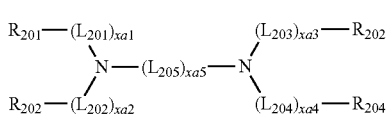

Formula 202

In Formulae 201 and 202, $L_{201}$ to $L_{205}$ may be each independently selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_2$-$C_{60}$ heteroarylene, and a substituted or unsubstituted divalent $C_6$-$C_{60}$ non-aromatic condensed polycyclic group;

xa1 to xa4 may be each independently selected from 0, 1, 2, and 3;

xa5 may be selected from 1, 2, 3, 4, and 5;

$R_{201}$ to $R_{204}$ may be each independently selected from a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, and a substituted or unsubstituted monovalent $C_6$-$C_{30}$ non-aromatic condensed polycyclic group.

In one embodiment, in Formulae 201 and 202, $L_{201}$ to $L_{205}$ may be each independently selected from:

a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrim-

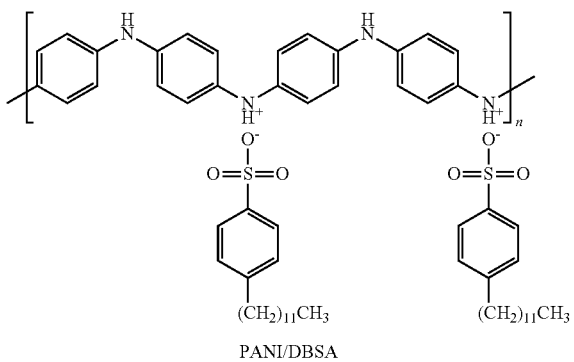

idinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In one embodiment, the compound of Formula 201 may be represented by Formula 201A.

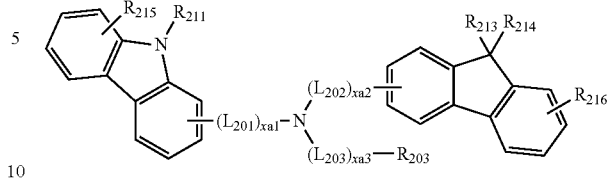

Formula 201A

For example, the compound of Formula 201 may be represented by Formula 201A-1, but is not limited thereto.

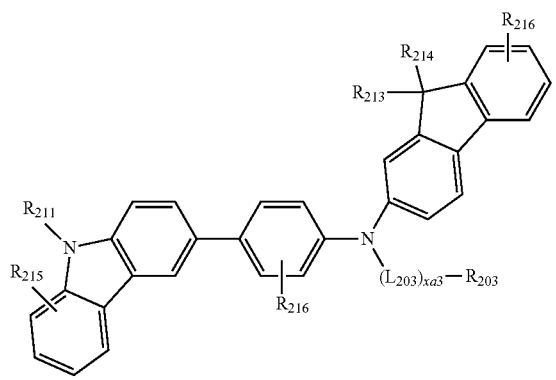

Formula 201A-1

In one embodiment, the compound of Formula 202 may be represented by Formula 202A, but is not limited thereto:

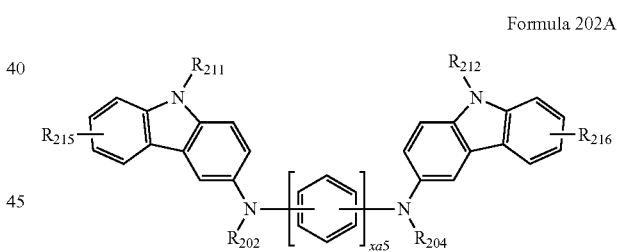

Formula 202A

In Formulae 201A, 201A-1, and 202A, $L_{201}$ to $L_{203}$, xa1 to xa3, xa5, and $R_{202}$ to $R_{204}$ may be as defined herein and above, $R_{211}$ may be defined as $R_{203}$, $R_{213}$ to $R_{216}$ may be each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a $C_6$-$C_{60}$ non-aromatic condensed polycyclic group.

In one embodiment, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from:

a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group, and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be linked to each other to form a saturated ring or an unsaturated ring.

The compound of Formula 201 and the compound of Formula 202 may each independently include, but are not limited to, Compounds HT1 to HT20:

HT1

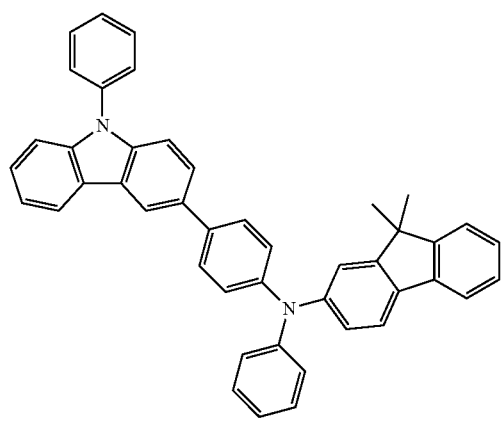

HT2

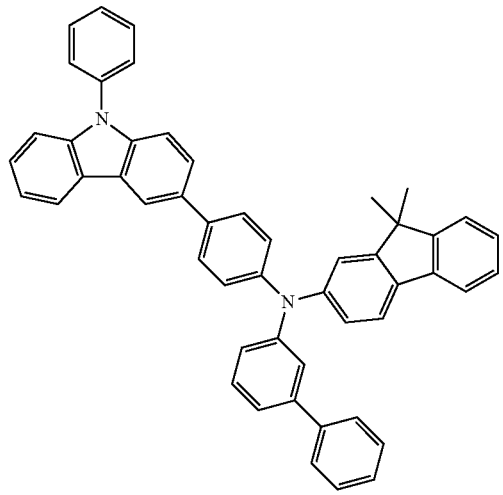

HT3

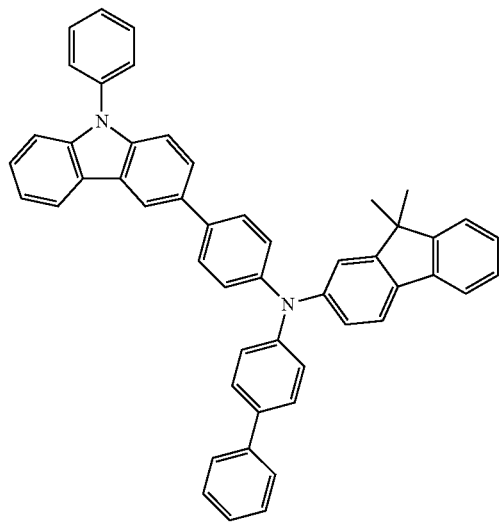

HT4

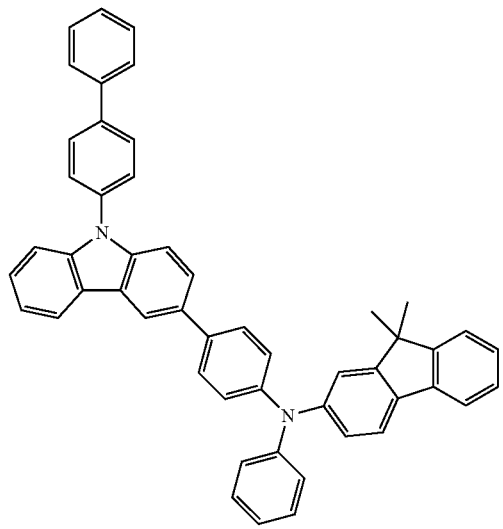

HT5
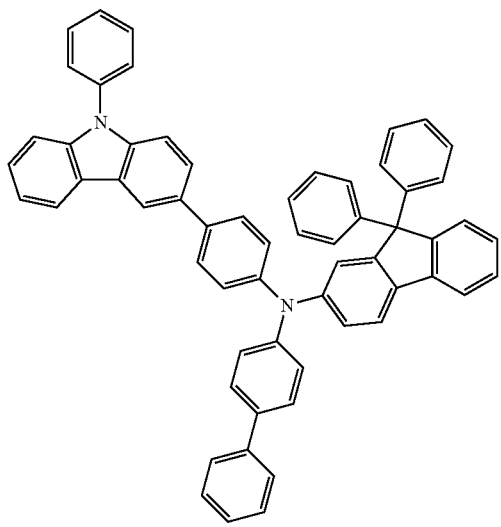
HT6
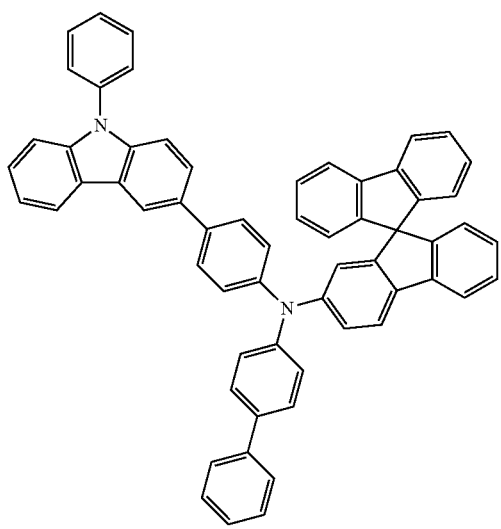
HT7
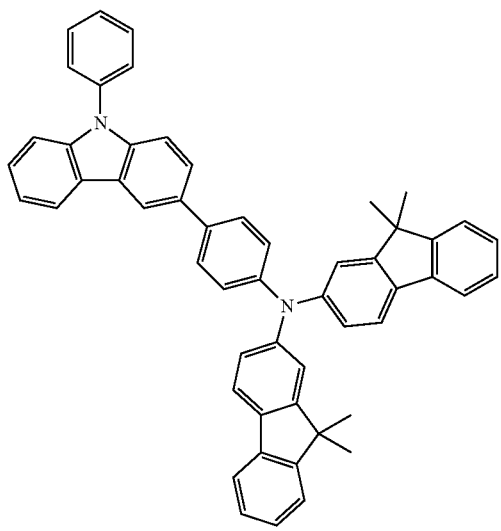
HT8
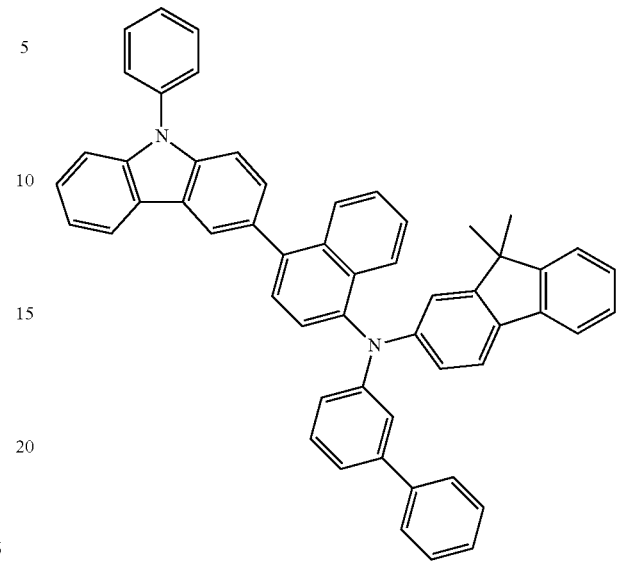
HT9
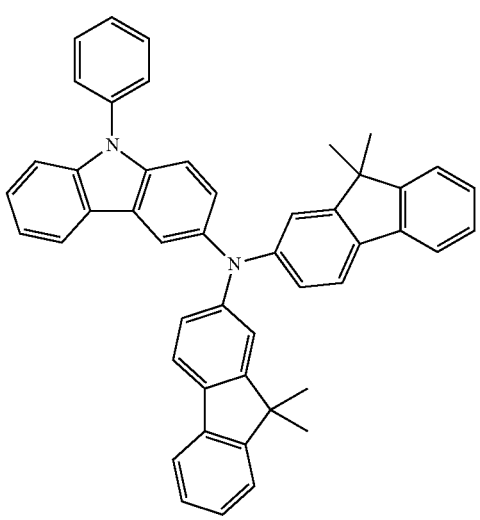
HT10
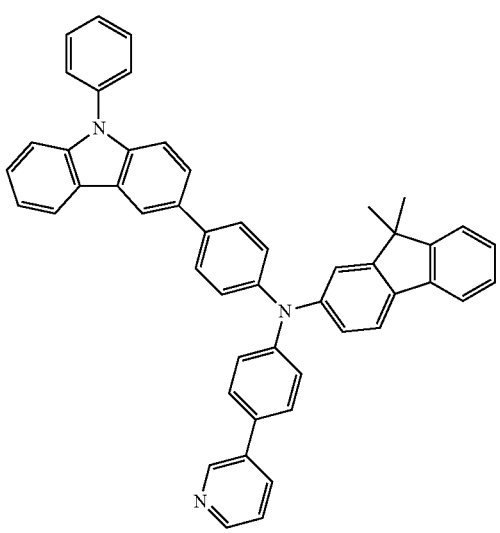

-continued
HT11
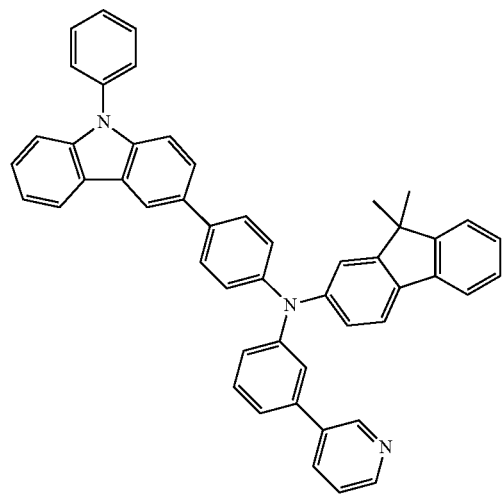
HT12
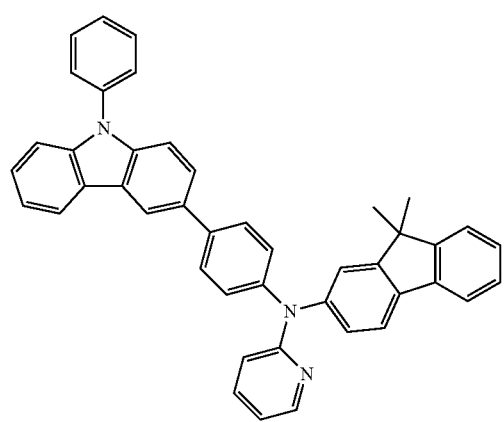
HT13
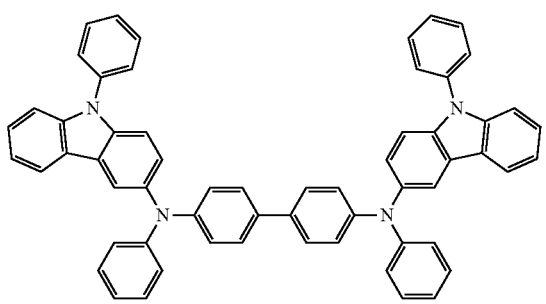
HT14
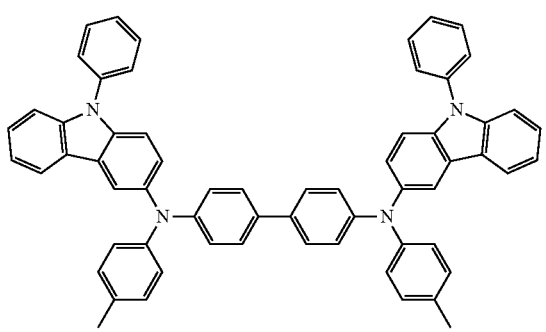
HT15
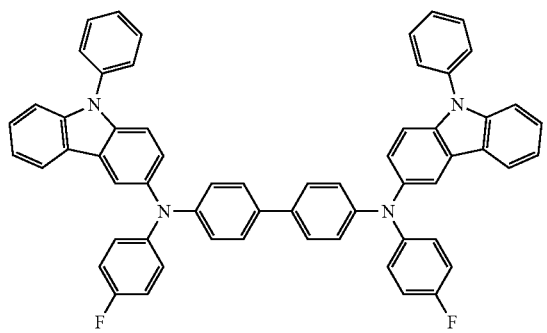
HT16
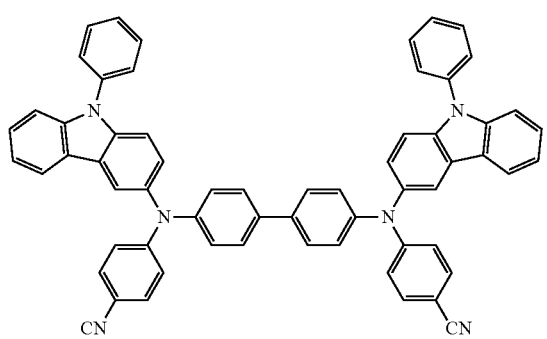
HT17
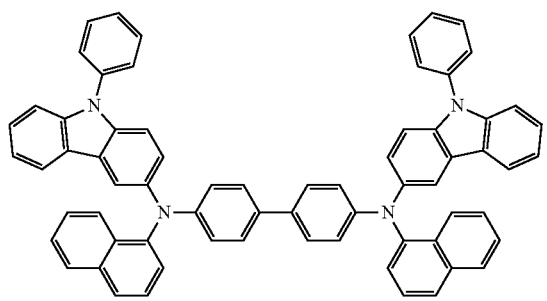
HT18
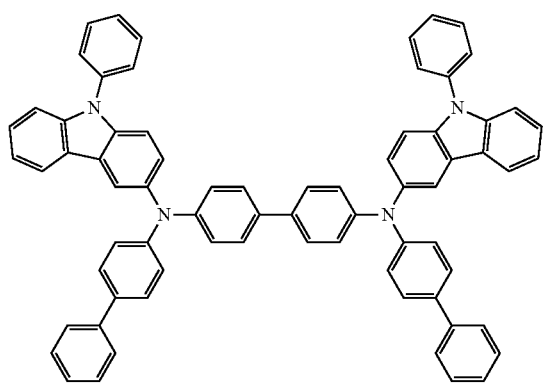

HT19

HT20

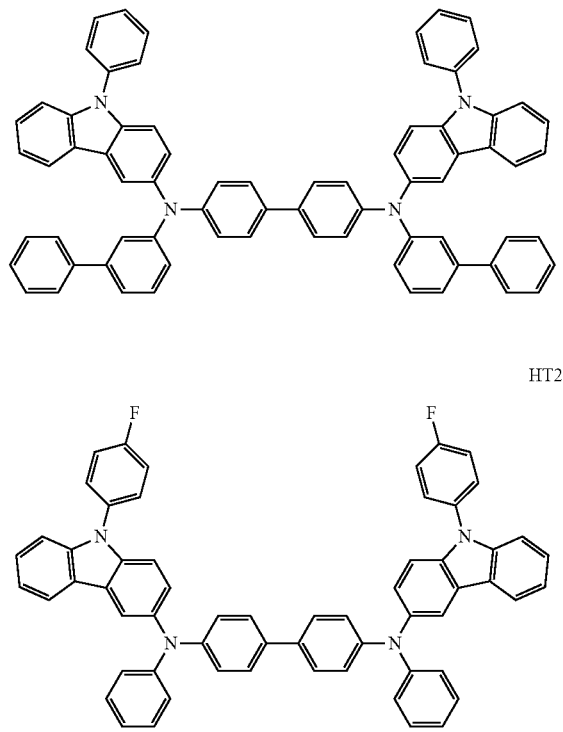

TCNQ  F4TCNQ

HATCN

A thickness of the hole transport region may be from about 100 Å to about 10,000 Å, and in some embodiments, from about 100 Å to about 1,000 Å. When the hole transport region includes both a HIL and a HTL, a thickness of the HIL may be from about 100 Å to about 10,000 Å (e.g about 9,950 Å), and in some embodiments, from about 100 Å to about 1,000 Å, and a thickness of the HTL may be from about 50 Å to about 2,000 Å, and in some embodiments, from about 100 Å to about 1,500 Å. When the thicknesses of the hole transport region, the HIL, and the HTL are within any of these ranges, satisfactory hole transport characteristics may be obtained without a substantial increase in driving voltage.

The hole transport region may further include a charge-generating material to improve conductivity, in addition to the materials described above. The charge-generating material may be homogeneously or inhomogeneously dispersed in the hole transport region.

The charge-generating material may be, for example, a p-dopant. The p-dopant may be one selected from quinone derivatives, metal oxides, and cyano group-containing compounds, but is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and Compound HATCN.

In one embodiment, the hole transport region may further include at least one of a buffer layer and an electron blocking layer (EBL), in addition to the HIL, the HTL, and the auxiliary emission layer. The buffer layer may compensate for an optical resonance distance of light according to a wavelength of the light emitted from the EML, and thus may improve light-emission efficiency. A material in the buffer layer may be any of the materials included in the hole transport region. The EBL may block injection of electrons from the hole transport region.

An EML may be formed on the first electrode or on the hole transport region by any of a variety of methods, for example, vacuum deposition, spin coating, casting, Langmuir-Blodgett (LB) deposition, inkjet printing, laser printing, laser induced thermal imaging (LITI), or the like. When the EML is formed by vacuum deposition or spin coating, the deposition and coating conditions for forming the EML may be similar to the above-described deposition and coating conditions for forming the HIL, and accordingly will not be described in more detail.

When the organic light-emitting device 10 is a full color organic light-emitting device, the EML may be patterned into a red emission layer, a green emission layer, and a blue emission layer to respectively correspond to individual subpixels. In some embodiments, the EML may have a structure in which a red emission layer, a green emission layer and a blue emission layer are stacked upon one another, or a structure including a mixture of a red light-emitting material, a green light-emitting material, and a blue light-emitting material, without separation into layers of different colors, and thus may emit white light.

The EML may include a host and a dopant.

The host may include at least one selected from TPBi, TBADN, ADN (also referred to herein as "DNA"), CBP, CDBP, and TCP:

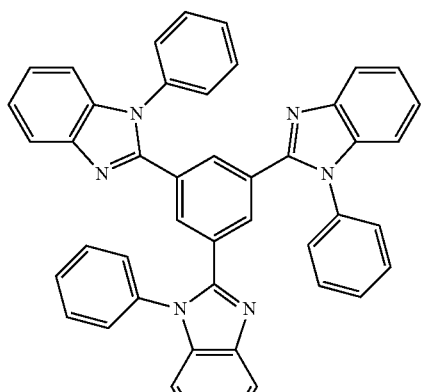

TPBI

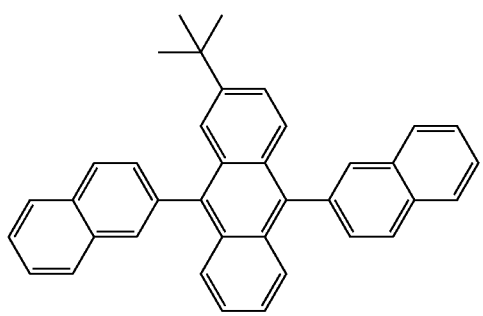

TBADN

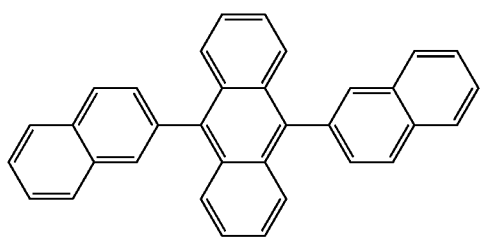

ADN

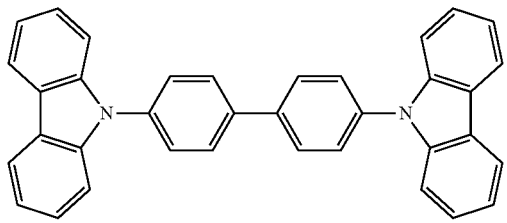

CBP

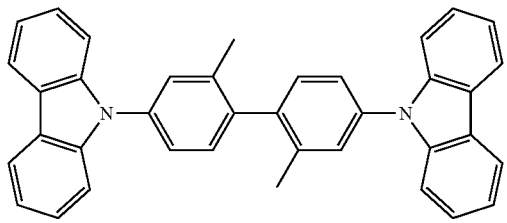

CDBP

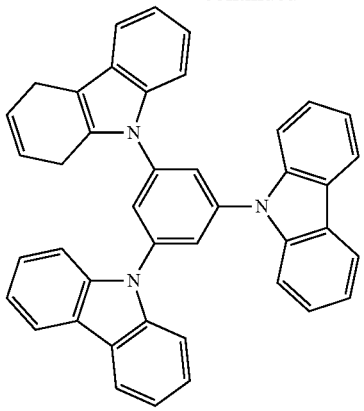

TCP

In some embodiments, the host may include a compound represented by Formula 301.

$$Ar_{301}\text{-}[(L_{301})_{xb1}\text{-}R_{301}]_{xb2}$$  Formula 301

In Formula 301, $Ar_{301}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent $C_2$-$C_{60}$ non-aromatic condensed polycyclic group, and —Si($Q_{301}$)($Q_{302}$)($Q_{303}$) (where $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

$L_{301}$ may be defined as $L_{201}$ in Formulae 201 and 202;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and xb2 may be selected from 1, 2, 3, and 4.

In one embodiment, in Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and $R_{301}$ may be selected from:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group. However, embodiments of the present disclosure are not limited thereto.

In one embodiment, the host may include a compound represented by Formula 301A.

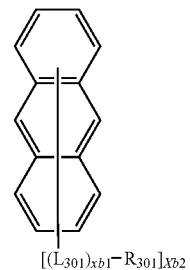

Formula 301A $[(L_{301})_{xb1}$-$R_{301}]_{xb2}$

Substituents in Formula 301A may be as defined above and herein.

The compound of Formula 301 may include, but is not limited to, at least one of Compounds H1 to H42.

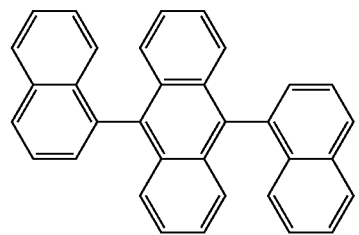

H1

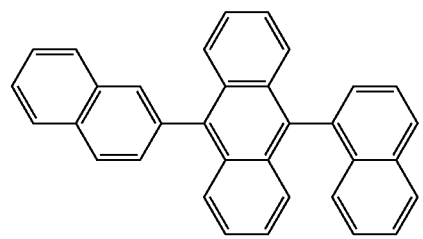

H2

H3
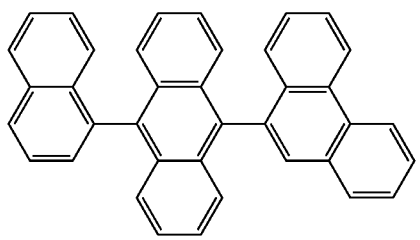
H4
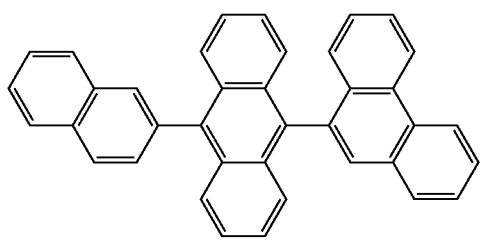
H5
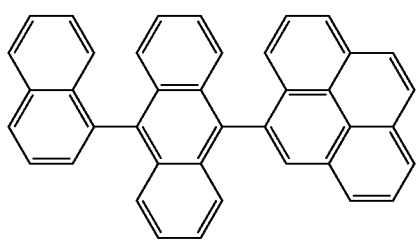
H6
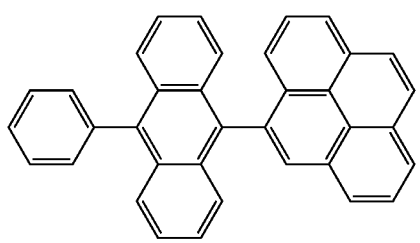
H7
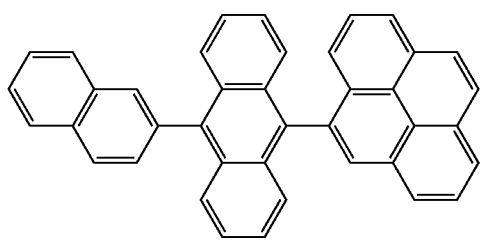
H8
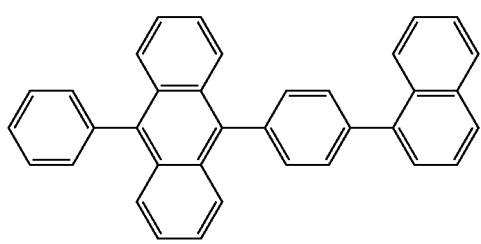
H9
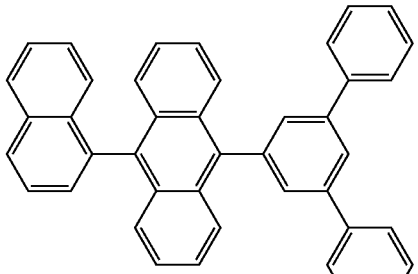
H10
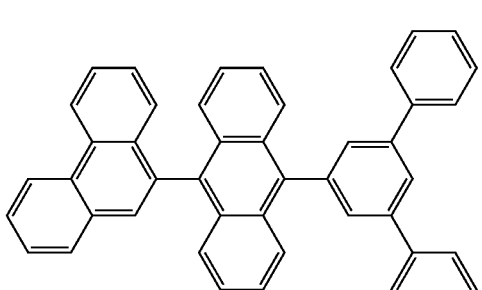
H11
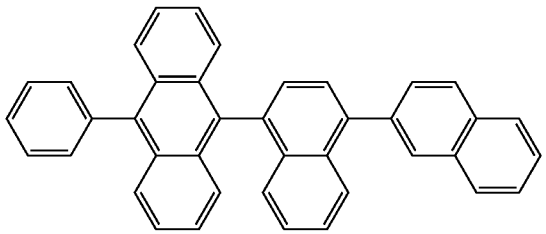
H12
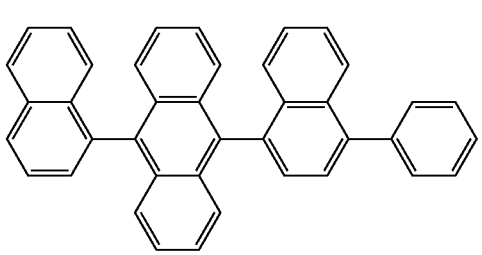
H13
H14

H15
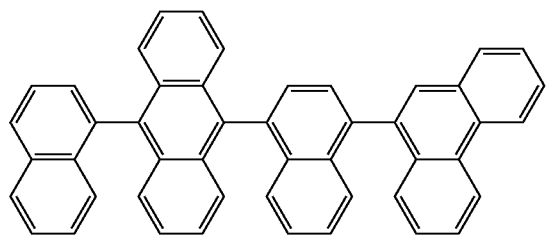
H16
H17
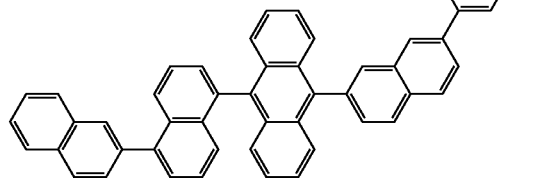
H18
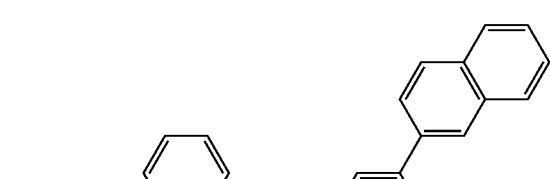
H19
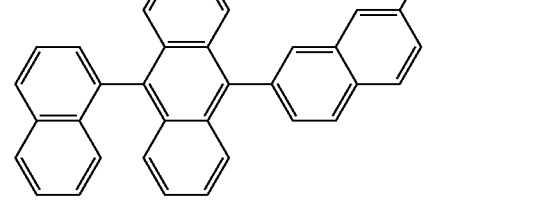
H20
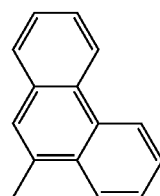
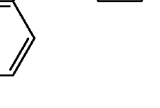
H21
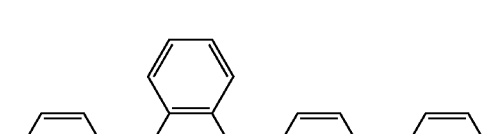
H22
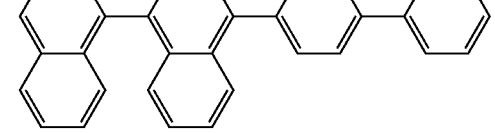
H23
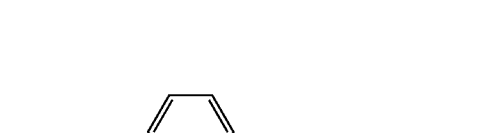
H24
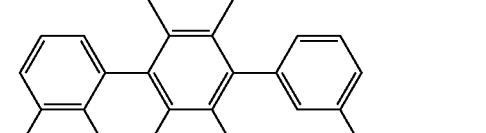

H25
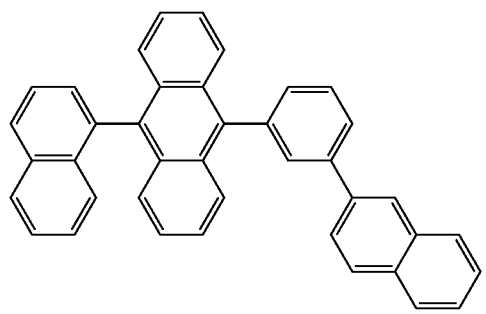
H26
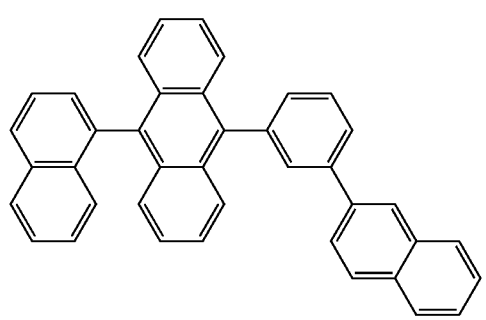
H27
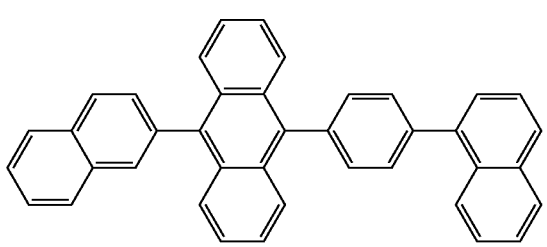
H28
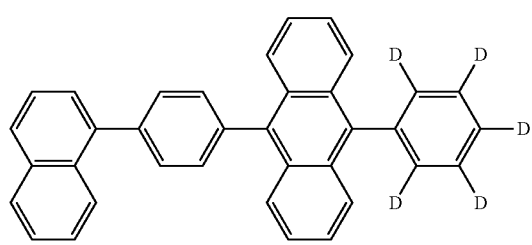
H29
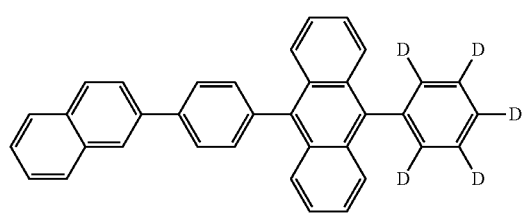
H30
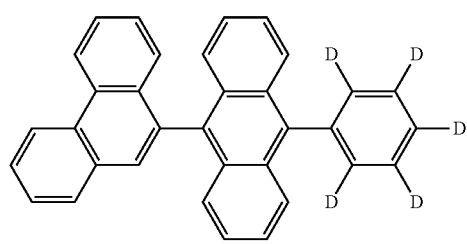
H31
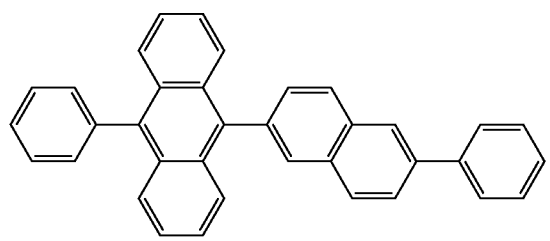
H32
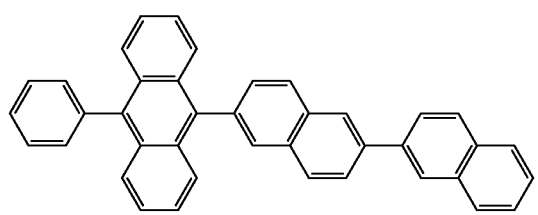
H33
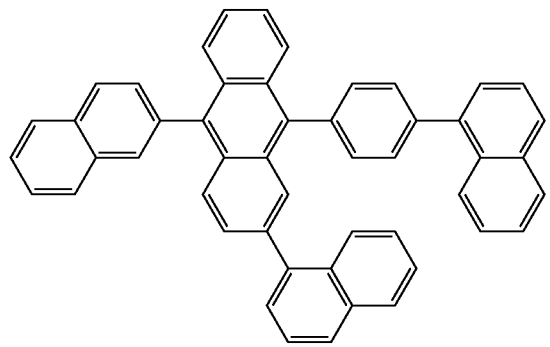
H34
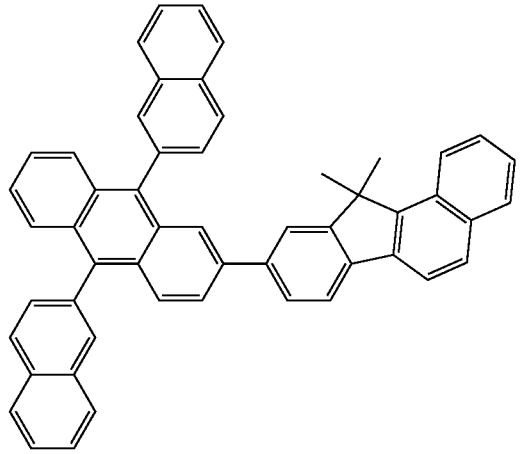

-continued
H35
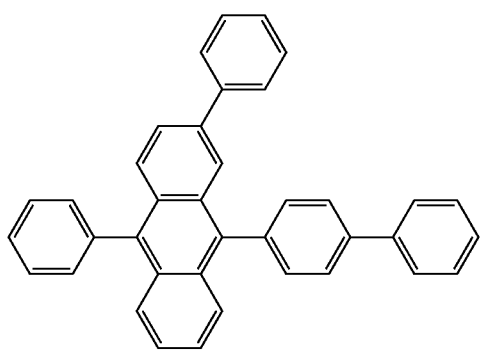
H36
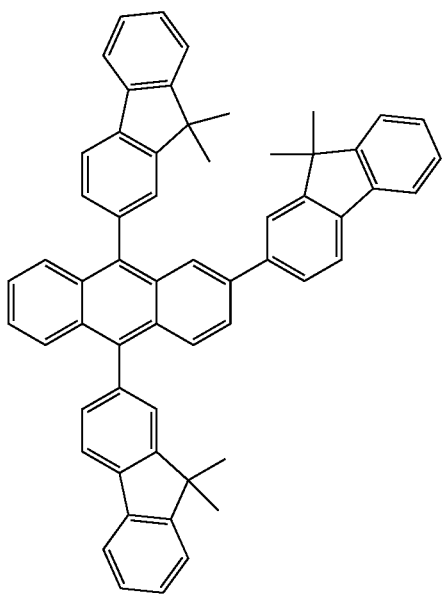
H37
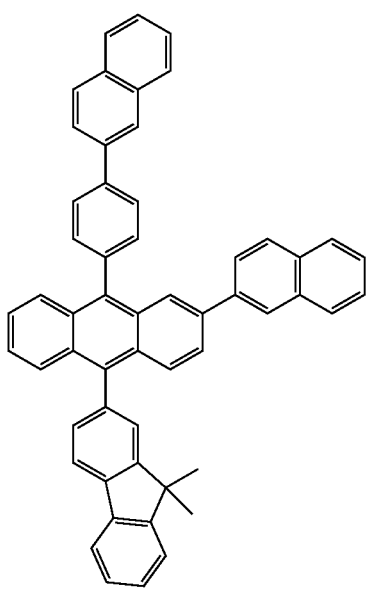
-continued
H38
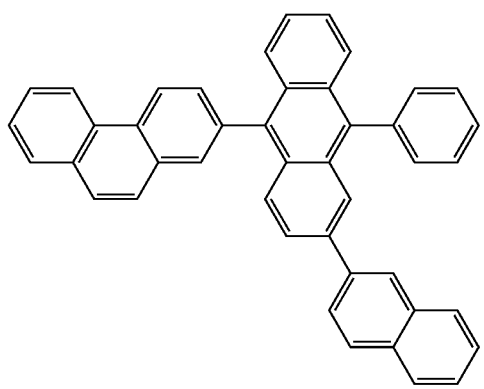
H39
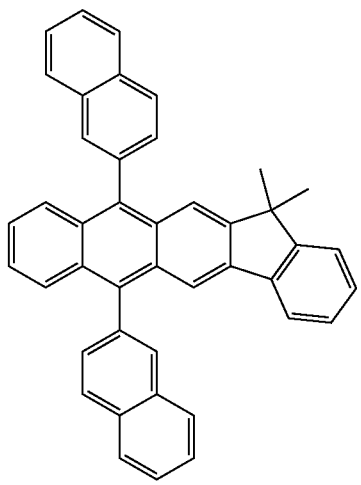
H40

H41
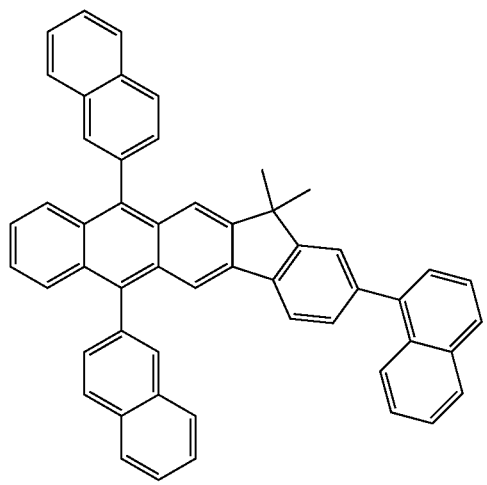
H42
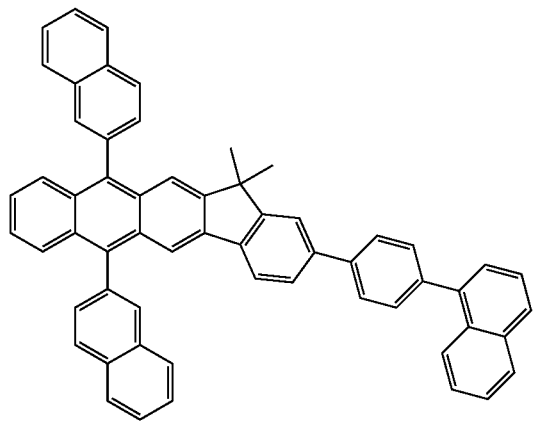
In some embodiments, the host may include, but is not limited to, at least one of Compounds H43 to H49:
H43
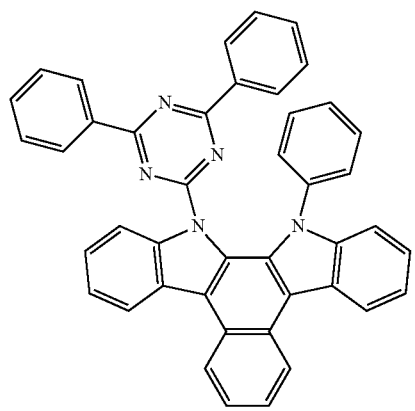
H44
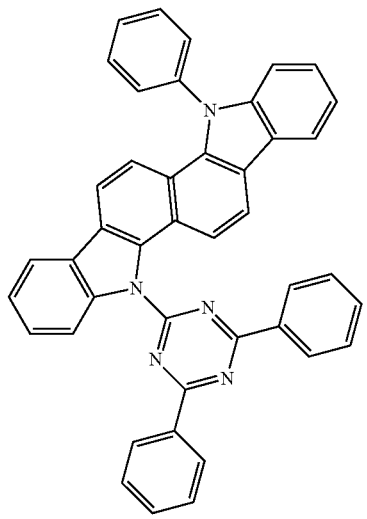
H45
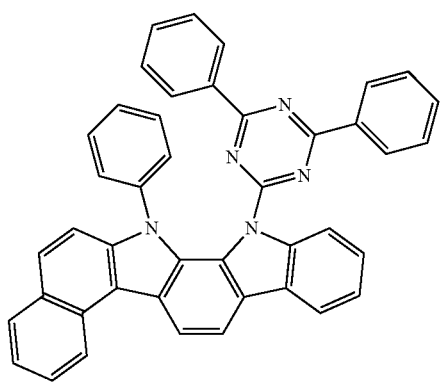
H46
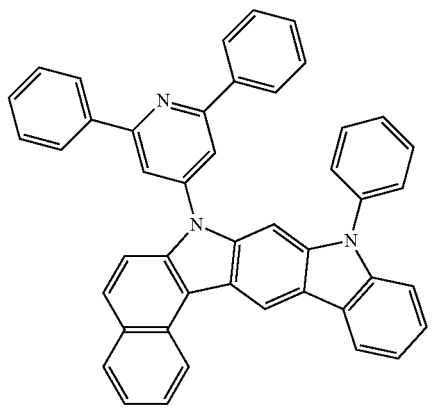

H47

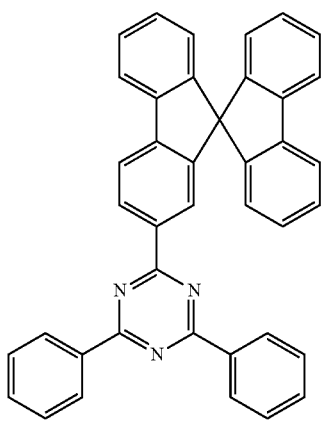

H48

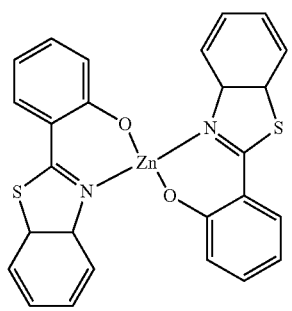

H49

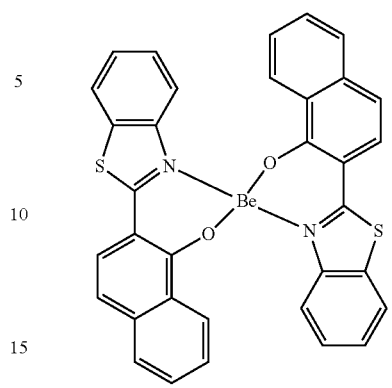

The dopant may be any suitable dopant, and may be at least one of a fluorescent dopant and a phosphorescent dopant. The phosphorescent dopant may be, for example, an organic metal complex including at least one or a combination of two or more of Ir, Pt, Os, Re, Ti, Zr, and Hf, but is not limited thereto.

Non-limiting examples of blue dopants include $F_2$Irpic (bis[3,5-difluoro-2-(2-pyridyl)phenyl](picolinato)iridium (III)), $(F_2ppy)_2$Ir(tmd), Ir(dfppz)$_3$, DPVBi (4,4'-bis(2,2'-diphenylethen-1-yl)biphenyl), DPAVBi (4,4'-bis[4-(diphenylamino)styryl]biphenyl), and TBPe (2,5,8,11-tetra-tert-butyl perylene).

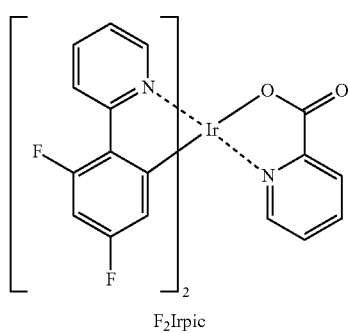

F$_2$Irpic

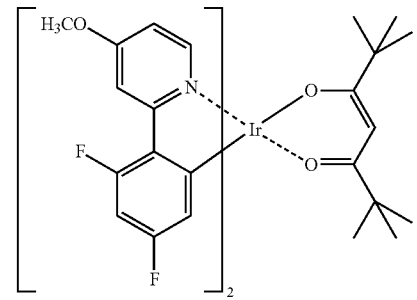

(F$_2$ppy)$_2$Ir(tmd)

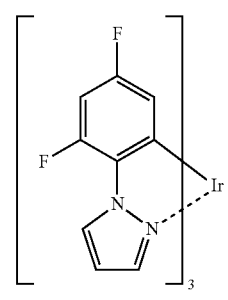

Ir(dfppz)$_3$

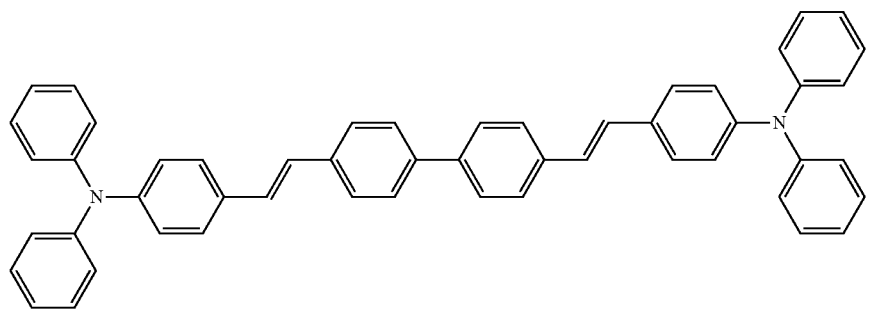

DPAVBi

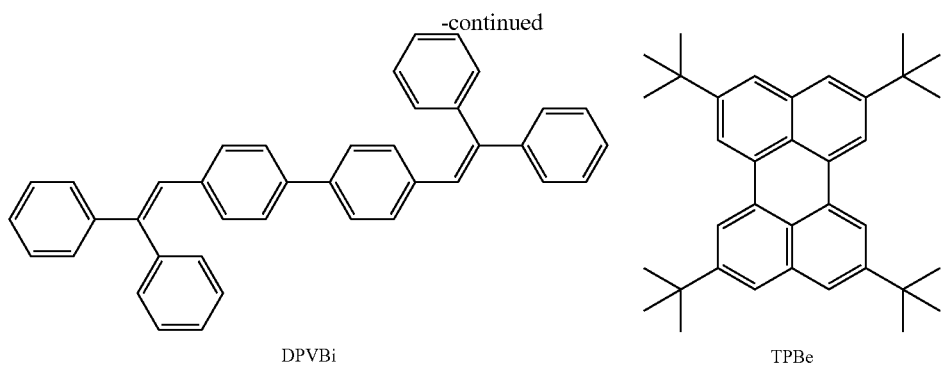
DPVBi
TPBe
Non-limiting examples of blue dopants also include the following compounds.
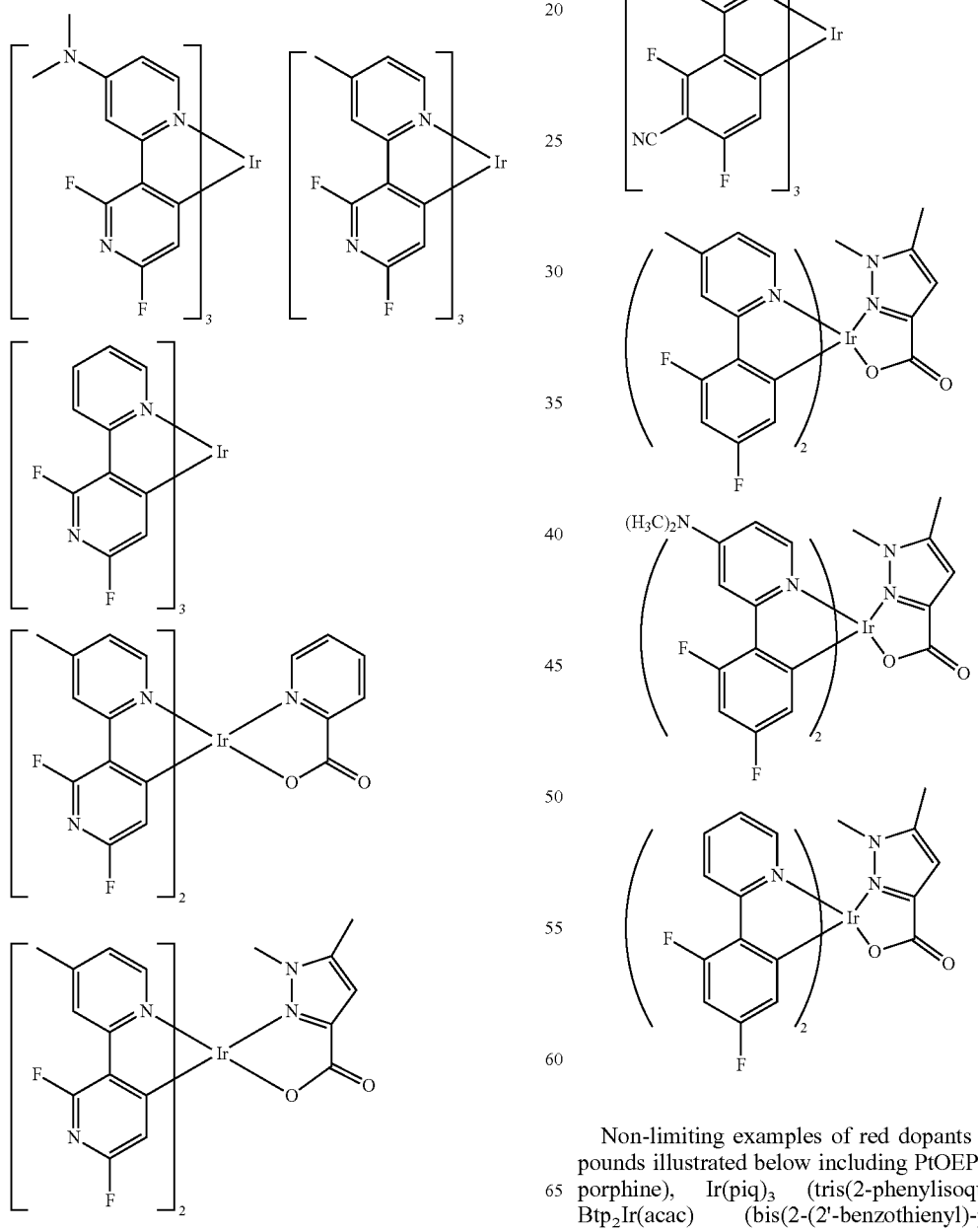
Non-limiting examples of red dopants include the compounds illustrated below including PtOEP (Pt(II) octaethylporphine), Ir(piq)$_3$ (tris(2-phenylisoquinoline)iridium), Btp$_2$Ir(acac) (bis(2-(2'-benzothienyl)-pyridinato-N,C3') iridium(acetylacetonate)), DCM (4-(dicyanomethylene)-2- methyl-6-[p-(dimethylamino)styryl]-4H-pyran), and DCJTB (4-(dicyanomethylene)-2-tert-butyl-6-(1,1,7,7,-tetramethyljulolidyl-9-enyl)-4H-pyran).
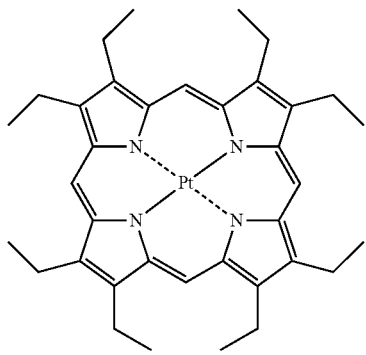
PtOEP
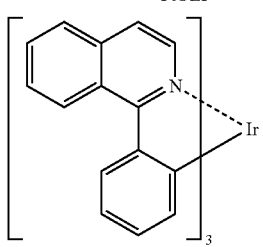
Ir(piq)3
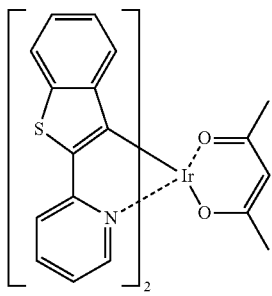
Btp2Ir(acac)
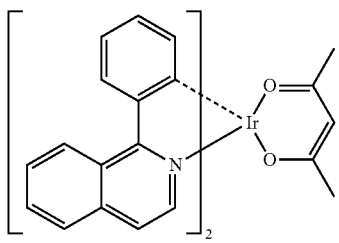
Ir(piq)2(acac)
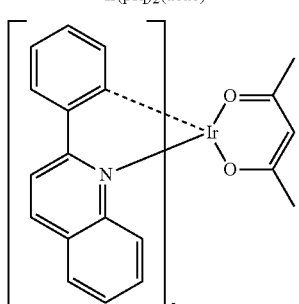
Ir(2-phq)2(acac)
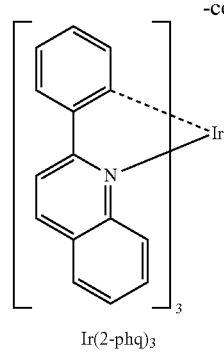
Ir(2-phq)3
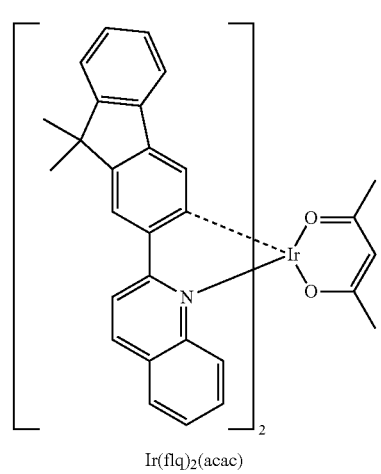
Ir(flq)2(acac)
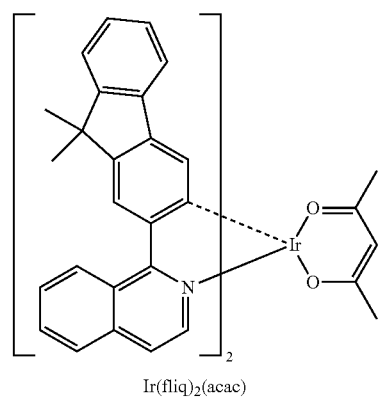
Ir(fliq)2(acac)
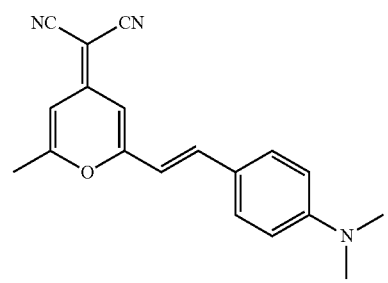
DCM

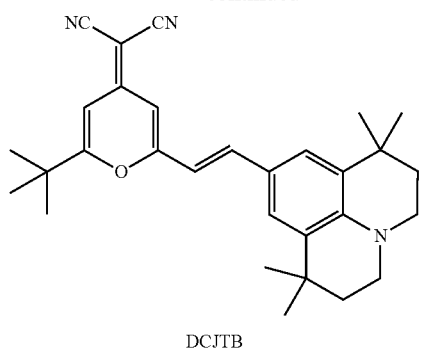

DCJTB

Non-limiting examples of green dopants include Ir(ppy)₃ (tris(2-phenylpyridine) iridium), Ir(ppy)₂(acac) (bis(2-phenylpyridine)(acetylacetonato)iridium(III)), Ir(mppy)₃ (tris (2-(4-tolyl)phenylpiridine)iridium), and C545T (10-(2-benzothiazolyl)-1,1,7,7-tetramethyl-2,3,6,7-tetrahydro-1H,5H, 11H-[1]benzopyrano[6,7,8-ij]-quinolizin-11-one).

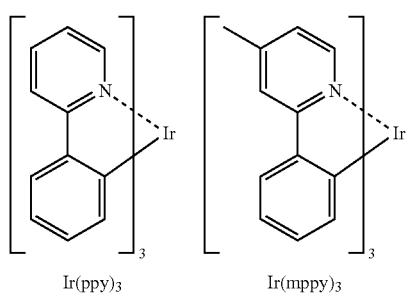

Ir(ppy)₃     Ir(mppy)₃

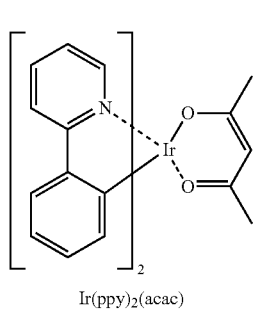

Ir(ppy)₂(acac)

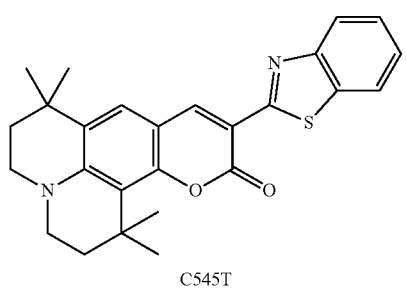

C545T

In one embodiment, the dopant included in the EML may be a Pt-complexe and may be selected from Compounds D1 to D50 illustrated below:

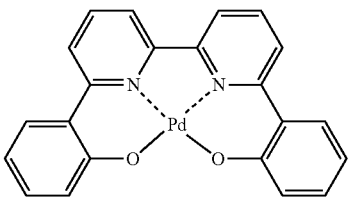
D1

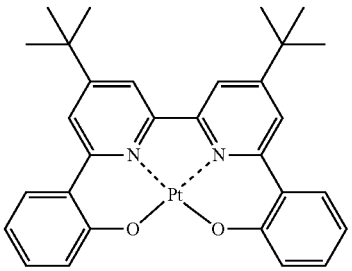
D2

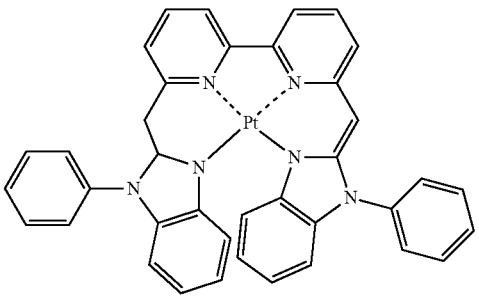
D3

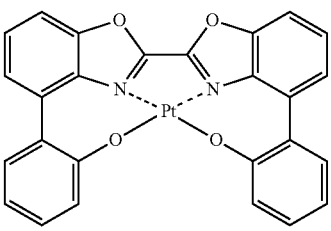
D4

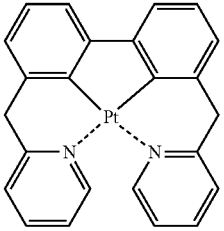
D5

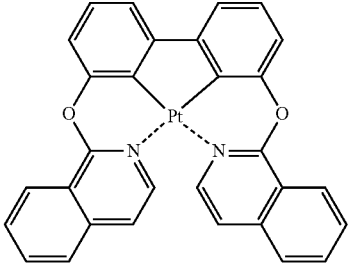
D6

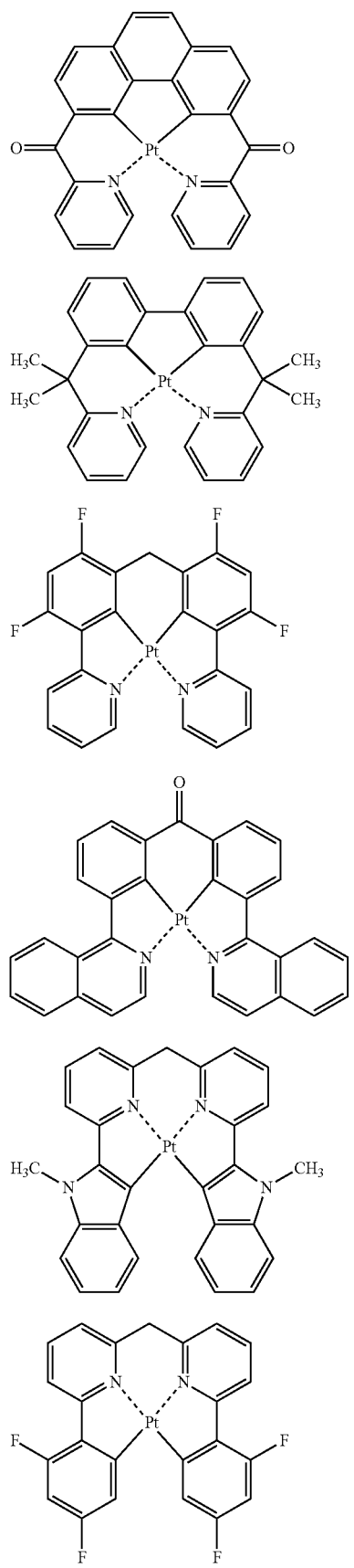
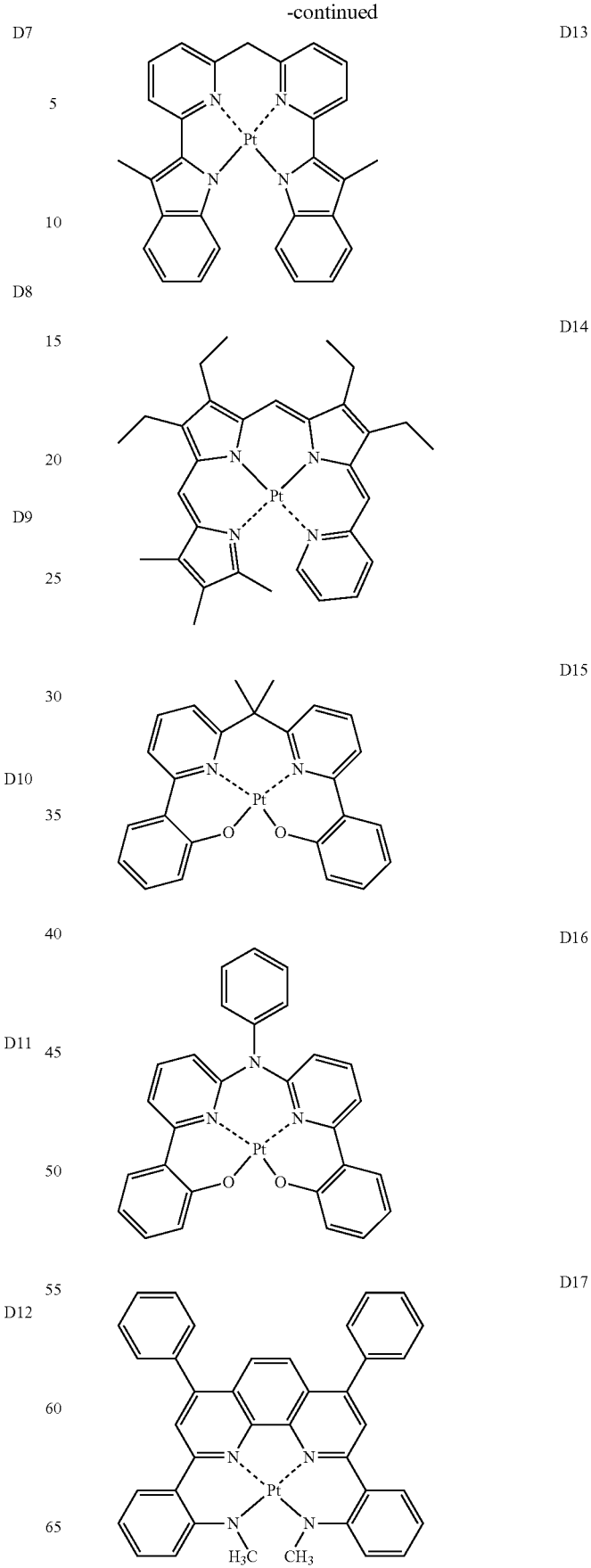

D18 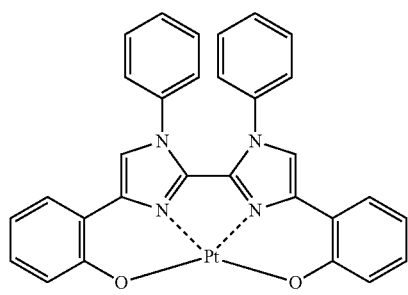
D19 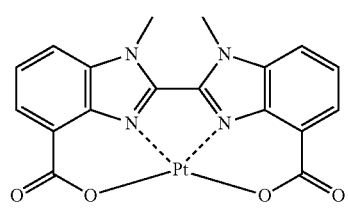
D20 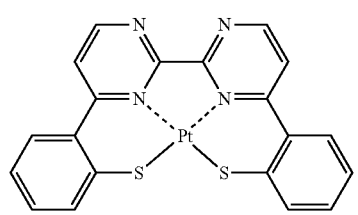
D21 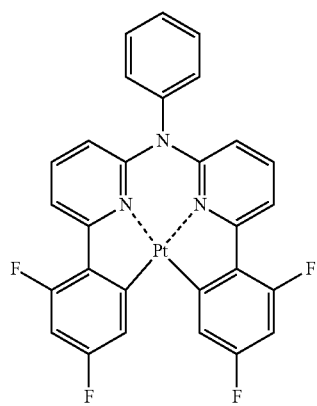
D22 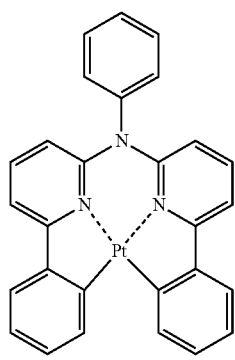
D23 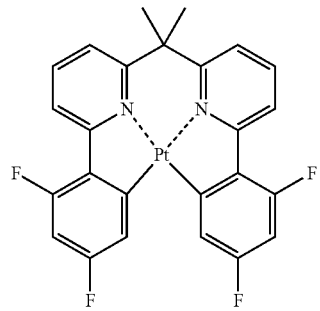
D24 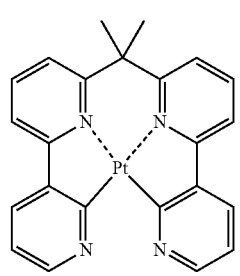
D25 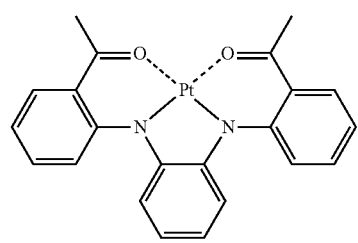
D26 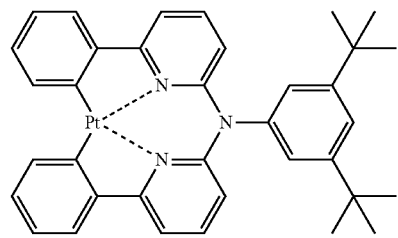
D27 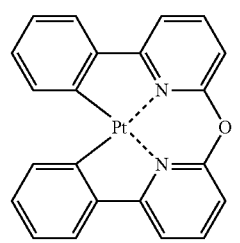
D28 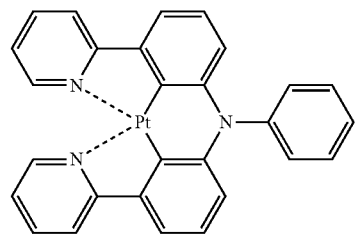

-continued
D29
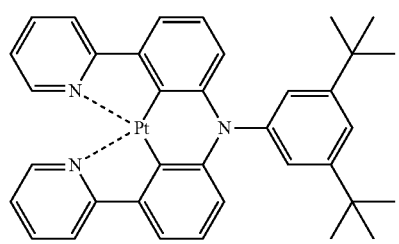
D30
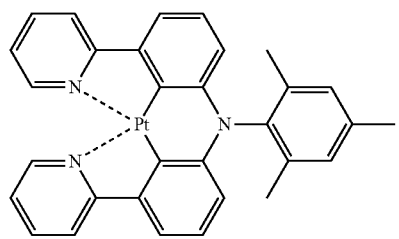
D31
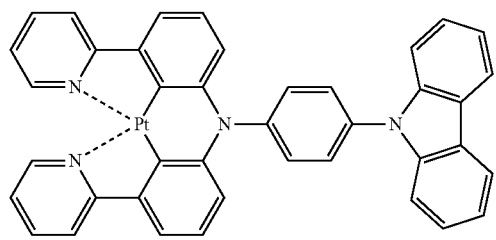
D32
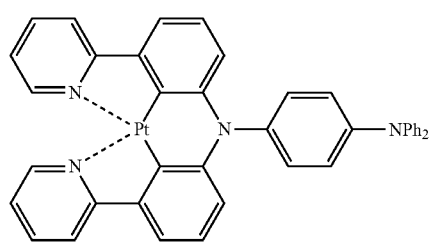
D33
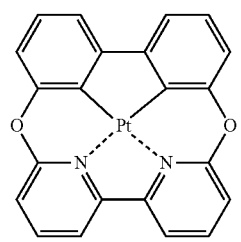
D34
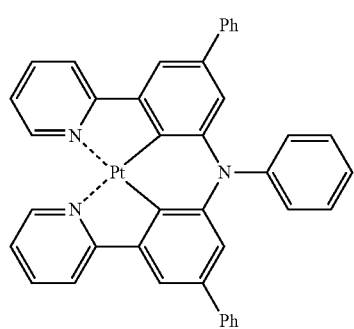
-continued
D35
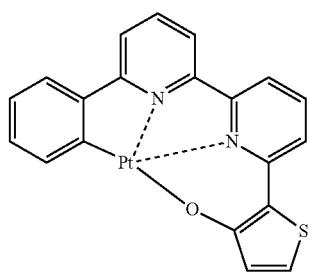
D36
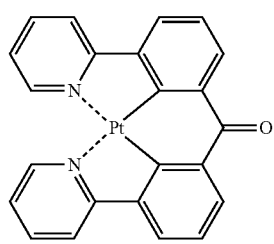
D37
D38
D39
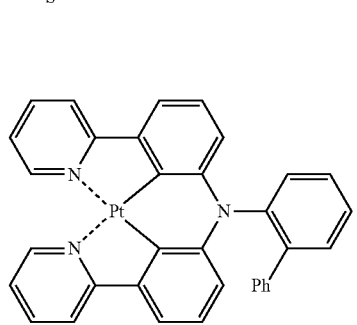

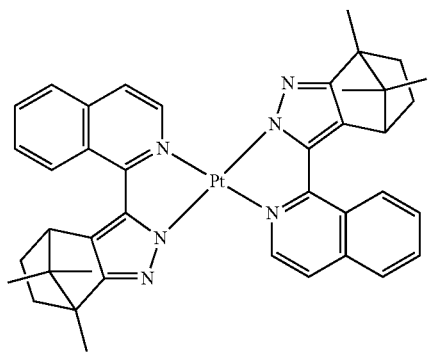
D40
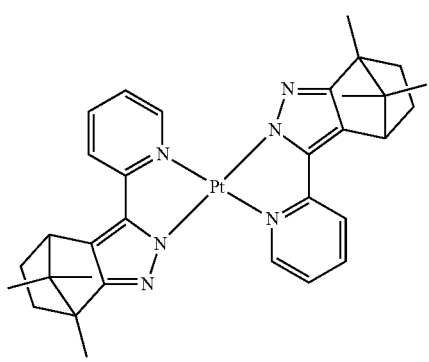
D41
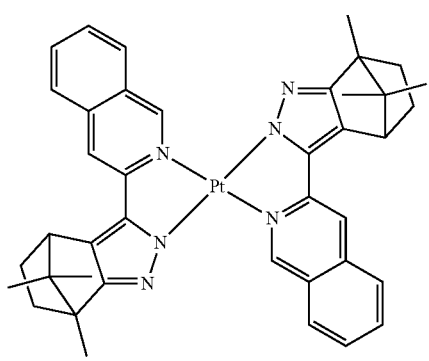
D42
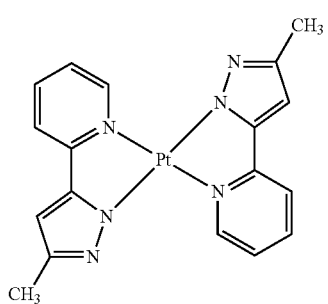
D43
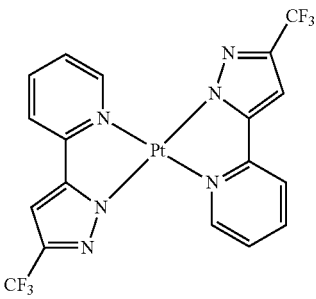
D44
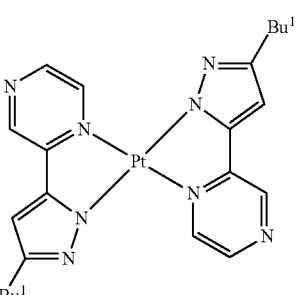
D45
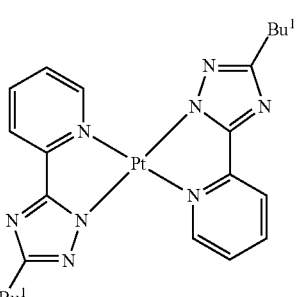
D46
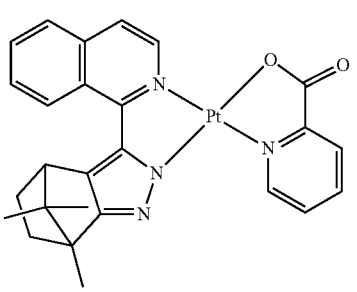
D47
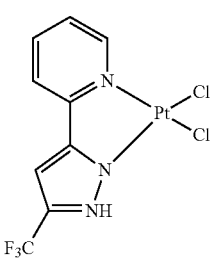
D48

-continued

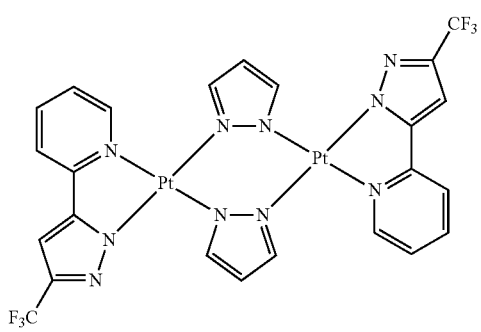

D49

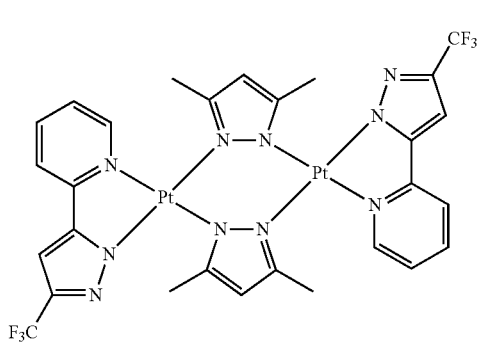

D50

In one embodiment, the dopant included in the EML may also include at least one of the following Os-complexes:

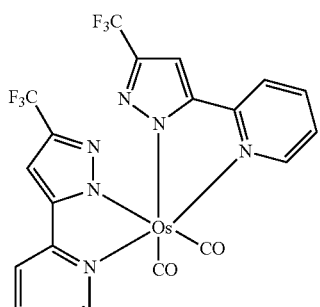

Os(fppz)₂(CO)₂

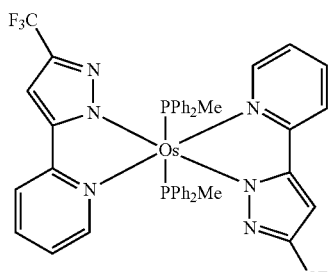

Os(fppz)₂(PPh₂Me)₂

-continued

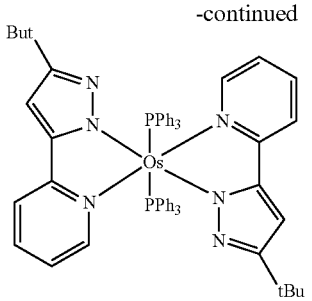

Os(bppz)₂(PPh₃)₂

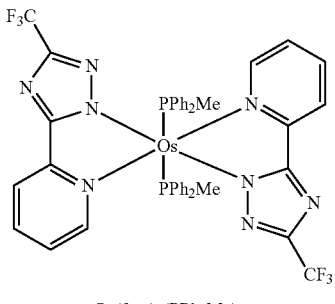

Os(fptz)₂(PPh₂Me)₂

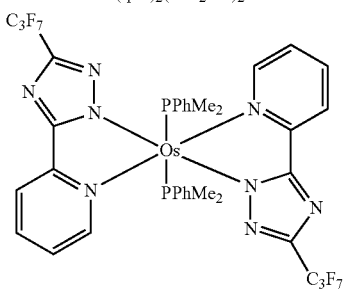

Os(hptz)₂(PPhMe₂)₂

An amount of the dopant in the EML may be from about 0.01 parts by weight to about 15 parts by weight based on 100 parts by weight of the host, but is not limited to this range.

A thickness of the EML may be from about 100 Å to about 1,000 Å, and in some embodiments, may be from about 200 Å to about 600 Å. When the thickness of the EML is within any of these ranges, the EML may have improved emission characteristics without a substantial increase in driving voltage.

An electron transport region may be positioned between the EML and the second electrode. The electron transport region may include, but is not limited to, at least one selected from a hole blocking layer (HBL), an electron transport layer (ETL), an electron injection layer (EIL), and an electron injection transport layer (EITL). For example, the electron transport region may have a structure of layers sequentially stacked on the EML, the structure including an ETL, an ETL/EIL, or a HBL/ETL/EIL, but the structure of the electron transport region is not limited thereto. The organic light-emitting device illustrated in the drawing may include an ETL and an EIL between the EML and the second electrode.

In one embodiment, the EML may include a phosphorescent dopant. When the EML includes a phosphorescent dopant, the organic light-emitting device may further include a HBL to prevent (or reduce) the diffusion of triplets or holes into the ETL.

When the electron transport region includes a HBL, the HBL may be formed on the EML by any of a variety of methods, including, for example, vacuum deposition, spin coating, casting, Langmuir-Blodgett (LB) deposition, inkjet printing, laser printing, laser induced thermal imaging (LITI), or the like. When the HBL is formed by vacuum deposition or spin coating, the deposition and coating conditions for forming the HBL may be similar to the above-described deposition and coating conditions for forming the HIL, and thus will not be described in more detail.

In one embodiment, the HBL may include at least one of BCP and Bphen. However, embodiments of the present disclosure are not limited thereto.

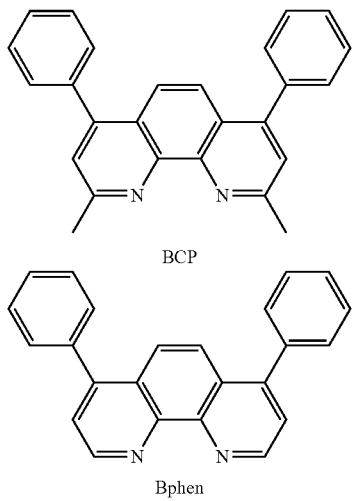

A thickness of the HBL may be from about 20 Å to about 1,000 Å, and in some embodiments, may be from about 30 Å to about 300 Å. When the thickness of the HBL is within any of these ranges, the HBL may have satisfactory hole blocking ability without a substantial increase in driving voltage.

The ETL may be formed on the EML or on the HBL by any of a variety of methods, for example, vacuum deposition, spin coating, casting, Langmuir-Blodgett (LB) deposition, inkjet printing, laser printing, laser induced thermal imaging (LITI), or the like. When the ETL is formed by vacuum deposition or spin coating, the deposition and coating conditions for forming the ETL may be similar to the above-described deposition and coating conditions for forming the HIL, and thus will not be described in more detail.

The ETL may include BCP, Bphen, Alq$_3$, Balq, TAZ, or NTAZ.

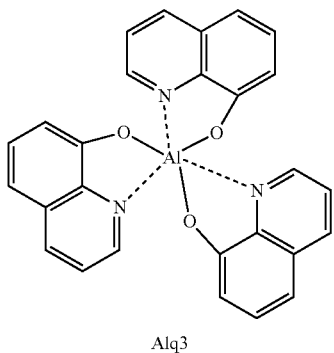

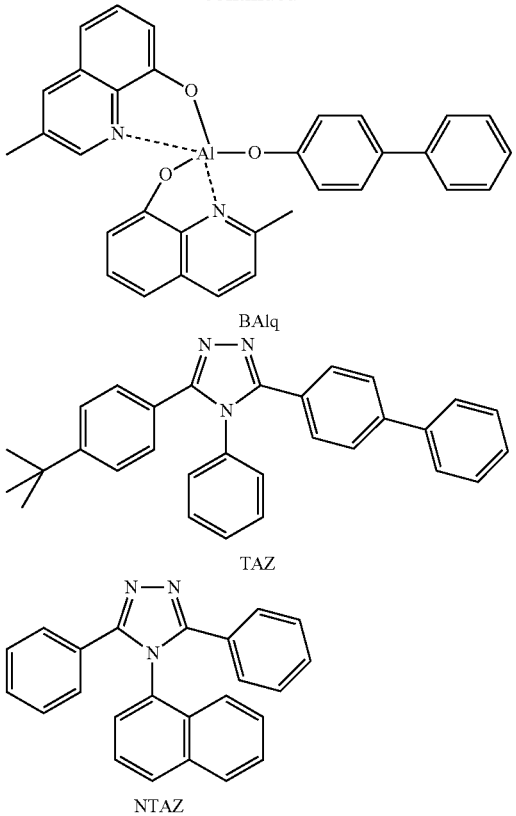

In some embodiments, the ETL may include at least one of the compounds represented by Formula 601.

$$Ar_{601}-[(L_{601})_{xe1}-E_{601}]_{xe2} \quad \text{Formula 601}$$

In Formula 601,
Ar$_{601}$ may be defined as Ar$_{301}$ in Formula 301;
L$_{601}$ may be defined as L$_{201}$ in Formula 201;
E$_{601}$ may be selected from:
a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuryl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuryl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovarenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuryl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3;
xe2 may be selected from 1, 2, 3, and 4.

In some embodiments, the ETL may include at least one of the compounds represented by Formula 602:

Formula 602

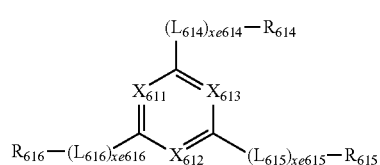

In Formula 602,
$X_{611}$ may be N or C-$(L_{611})$xe$_{611}$-$R_{611}$;
$X_{612}$ may be N or C-$(L_{612})$xe$_{612}$-$R_{612}$;
$X_{613}$ may be N or C-$(L_{613})$xe$_{613}$-$R_{613}$;
at least one of $X_{611}$ to $X_{613}$ may be N;
$L_{611}$ to $L_{616}$ may be each independently defined as $L_{201}$ in Formula 201;
$R_{611}$ to $R_{616}$ may be each independently selected from:
a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe$_{611}$ to xe$_{616}$ may be each independently selected from 0, 1, 2, and 3.

The compound of Formula 601 and the compound of Formula 602 may each independently include at least one of Compounds ET1 to ET15:

ET1

ET2

77
-continued
ET3
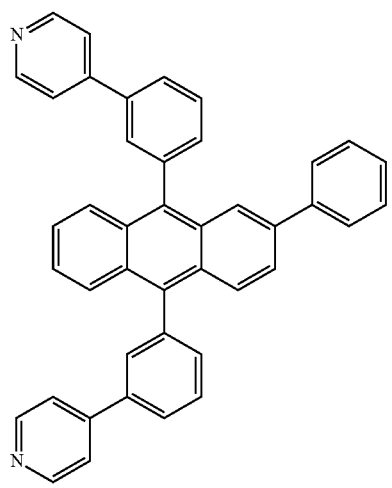
ET4
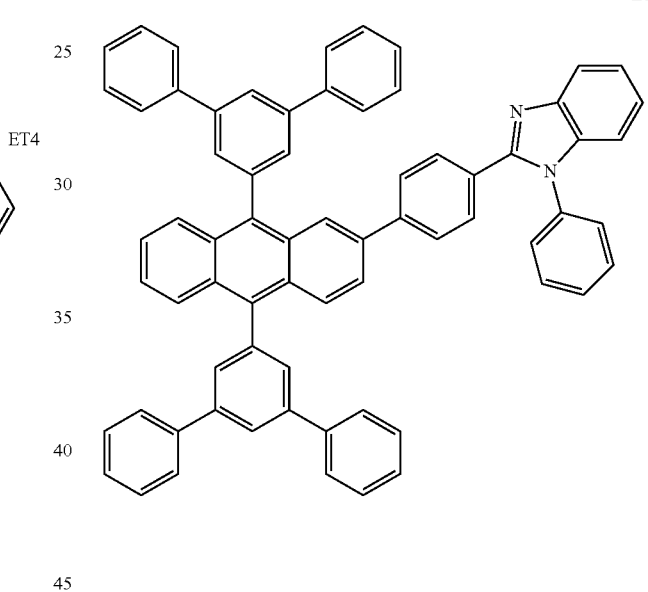
ET5
78
-continued
ET6
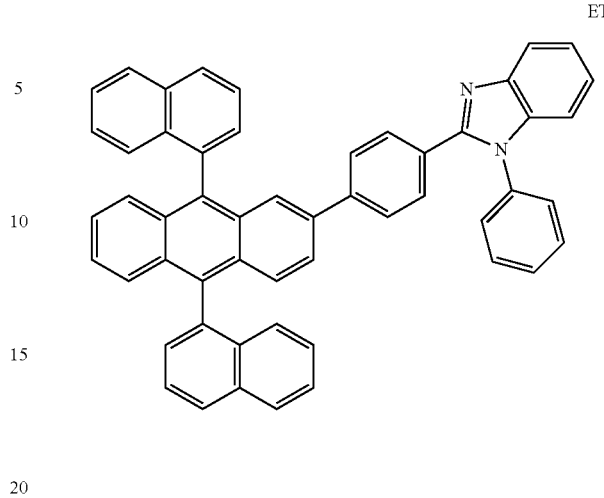
ET7
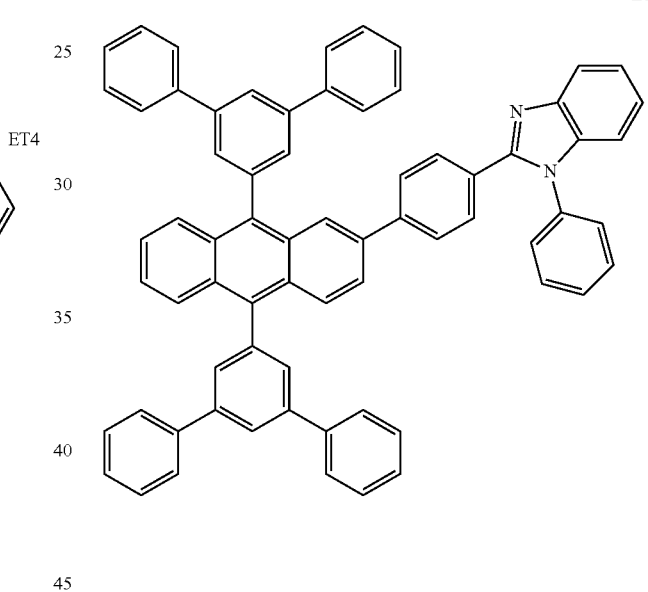
ET8
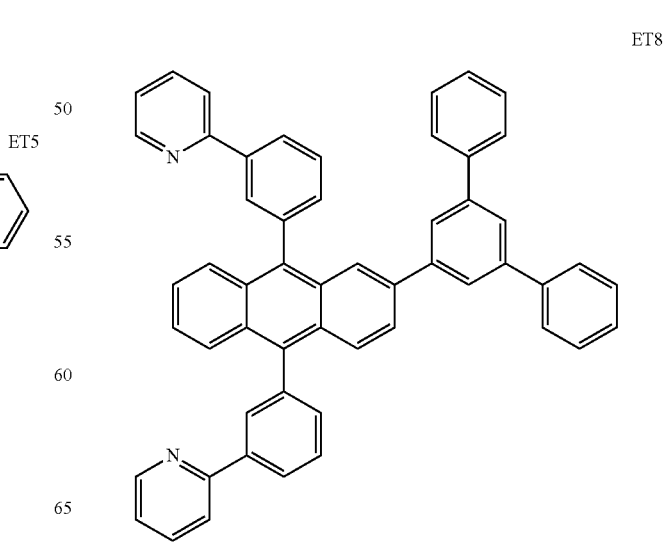

ET9
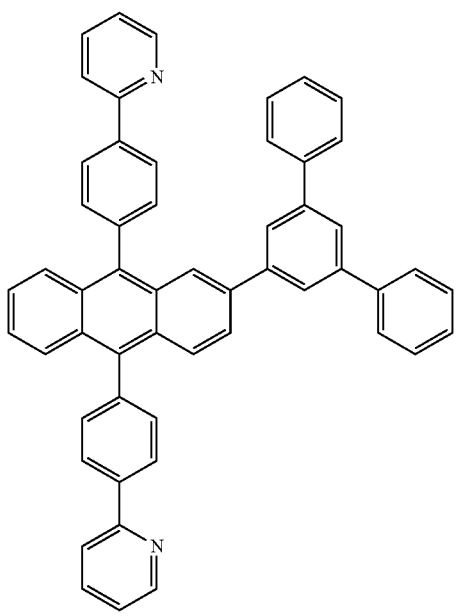
ET11
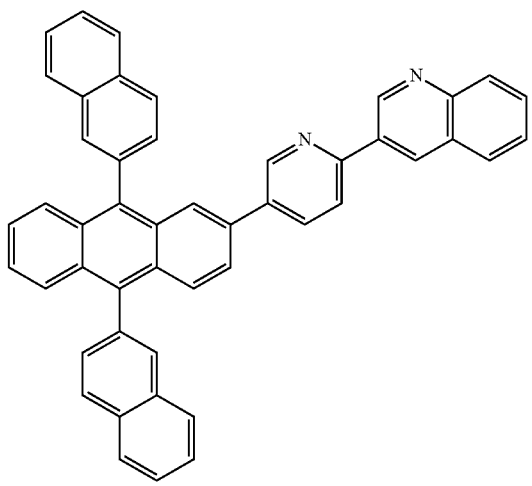
ET12
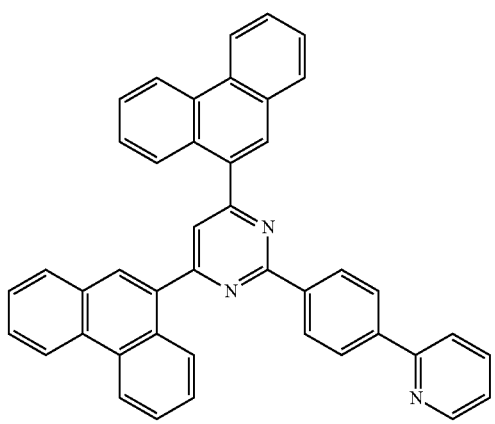
ET10
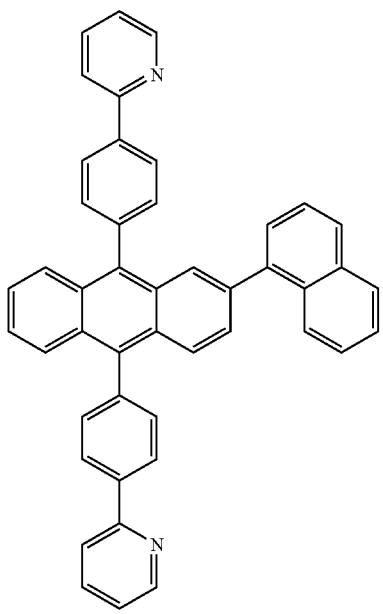
ET13
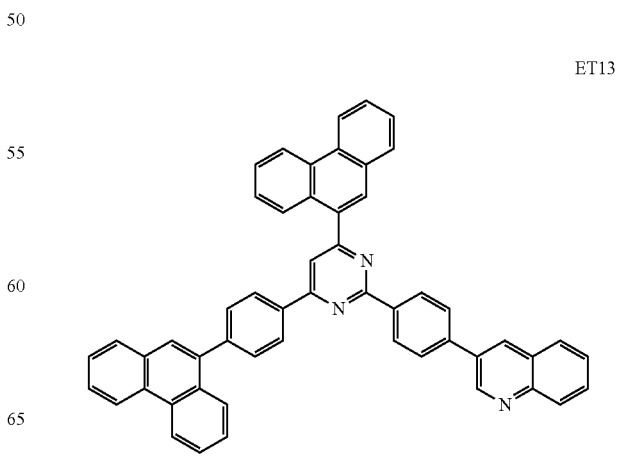

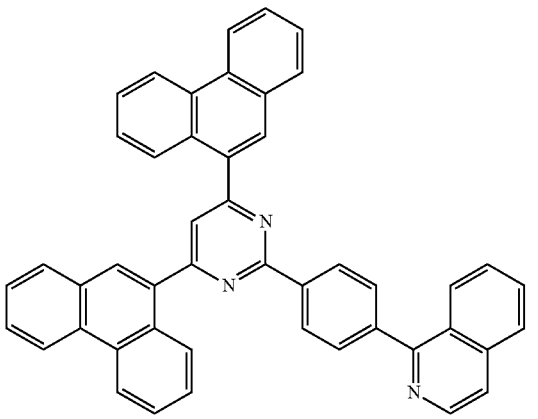
ET14

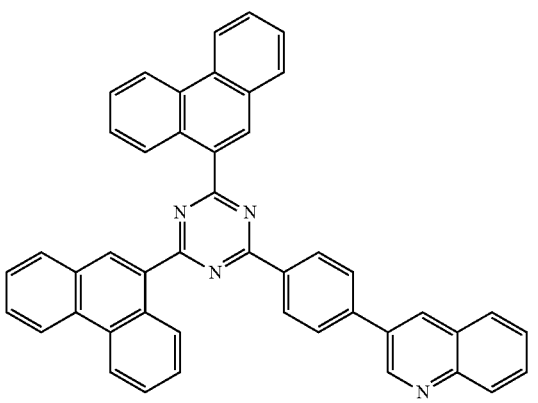
ET15

A thickness of the ETL may be from about 100 Å to about 1,000 Å, and in some embodiments, may be from about 150 Å to about 500 Å. When the thickness of the ETL is within any of these ranges, the ETL may have satisfactory electron transporting ability without a substantial increase in driving voltage.

In some embodiments, the ETL may further include a metal-containing material, in addition to the above-described materials.

The metal-containing material may include a Li complex. Non-limiting examples of the Li complex include LiQ (lithium quinolate) and LiBTz (lithium [2-(2-hydroxyphenyl)benzothiazole]).

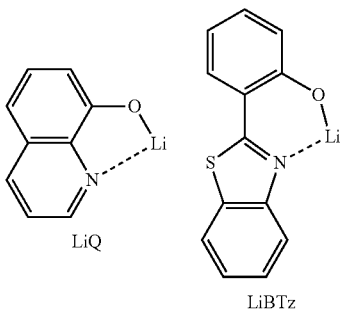
LiQ    LiBTz

The EIL may facilitate the injection of electrons from the second electrode.

The EIL may be formed on the ETL by any of a variety of methods, for example, by vacuum deposition, spin coating, casting, Langmuir-Blodgett (LB) deposition, inkjet printing, laser printing, laser induced thermal imaging (LITI), or the like. When the EIL is formed by vacuum deposition or spin coating, the deposition and coating conditions for forming the EIL may be similar to the above-described deposition and coating conditions for forming the HIL, and thus will not be described in more detail.

The EIL may include at least one selected from LiF, NaCl, CsF, $Li_2O$, BaO, and LiQ.

A thickness of the EIL may be from about 1 Å to about 100 Å, and in some embodiments, may be from about 3 Å to about 90 Å. When the thickness of the EIL is within any of these ranges, the EIL may have satisfactory electron injection ability without a substantial increase in driving voltage.

As described above, the second electrode may be positioned on the EIL. The second electrode may be a cathode (which is an electron injecting electrode). A material for forming the second electrode, may be a metal, an alloy, or an electrically conductive compound, that all have a low-work function, or a mixture thereof. Non-limiting examples of the materials for forming the second electrode include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode may be ITO or IZO. The second electrode may be a reflective electrode, a semi-transmissive electrode, or a transmissive electrode.

Although the organic light-emitting device has been described above in connection with the drawing, embodiments of the present disclosure are not limited thereto.

As used herein, an alkyl group refers to a monovalent linear or branched aliphatic hydrocarbon group. Non-limiting examples of the alkyl group include a methyl group, an ethyl group, a propyl group, an isobutyl group, a sec-butyl group, a ter-butyl group, a pentyl group, an iso-amyl group, and a hexyl group. As used herein, an alkylene group refers to a divalent group having the same structure as the alkyl group.

As used herein, an alkoxy group refers to a monovalent group represented by —$OA_{101}$ (where $A_{101}$ is a $C_1$-$C_{60}$ alkyl group as described above). Non-limiting examples of the alkoxy group include a methoxy group, an ethoxy group, and an isopropyloxy group.

As used herein, an alkenyl group refers to a monovalent hydrocarbon group including at least one carbon-carbon double bond at one or more positions along a carbon chain of the alkyl group. For example, the alkenyl group may include a terminal alkene and/or an internal alkene (e.g. at the middle of the carbon chain), and non-limiting examples of the alkenyl group include an ethenyl group, a propenyl group, and a butenyl group. As used herein, an alkenylene group refers to a divalent group having the same structure as the alkenyl group.

As used herein, an alkynyl group refers to a monovalent hydrocarbon group including at least one carbon-carbon triple bond at one or more positions along a carbon chain of the alkyl group. For example, the alkynyl group may include a terminal alkyne and/or an internal alkyne (e.g. at the middle of the carbon chain), and non-limiting examples of the alkynyl group include an ethynyl group and a propynyl group. As used herein, an alkynylene group refers to a divalent group having the same structure as the alkynyl group.

As used herein, a cycloalkyl group refers to a monovalent, monocyclic hydrocarbon group. Non-limiting examples of the cycloalkyl group include a cyclopropyl group, a cyclobutyl group, a cyclopentyl group, a cyclohexyl group, and a cycloheptyl group. As used herein, a cycloalkylene group refers to a divalent group having the same structure as the cycloalkyl group.

As used herein, a heterocycloalkyl group refers to a monovalent monocyclic group including at least one hetero atom selected from N, O, P, and S as a ring-forming atom, and carbon atoms as the remaining ring-forming atoms. Non-limiting examples of the heterocycloalkyl group include a tetrahydrofuranyl group and a tetrahydrothiophenyl group. As used herein, a heterocycloalkylene group refers to a divalent group having the same structure as the heterocycloalkyl group.

As used herein, a cycloalkenyl group refers to a monovalent monocyclic hydrocarbon group that includes at least one carbon-carbon double bond in the ring, but does not have aromaticity. Non-limiting examples of the cycloalkenyl group include a cyclopentenyl group, a cyclohexenyl group, and a cycloheptenyl group. As used herein, a cycloalkenylene group refers to a divalent group having the same structure as the cycloalkenyl group.

As used herein, a heterocycloalkenyl group refers to a monovalent monocyclic group that includes at least one hetero atom selected from N, O, P, and S as a ring-forming atom (and carbon atoms as the remaining ring-forming atoms) and has at least one double bond in the ring. Non-limiting examples of the heterocycloalkenyl group include a 2,3-hydrofuranyl group and a 2,3-hydrothiophenyl group. As used herein, a heterocycloalkenylene group refers to a divalent group having the same structure as the heterocycloalkenyl group.

As used herein, an aryl group refers to a monovalent group having an aromatic carbocyclic system, and an arylene group refers to a divalent group having an aromatic carbocyclic system. Non-limiting examples of the aryl group include a phenyl group, a naphthyl group, an anthracenyl group, a phenanthrenyl group, a pyrenyl group, and a chrysenyl group. When the aryl group and/or the arylene group have at least two rings, the respective at least two rings may be fused to each other.

As used herein, a heteroaryl group refers to a monovalent, aromatic carbocyclic system including at least one hetero atom selected from N, O, P, and S as a ring-forming atom, and carbon atoms as the remaining ring-forming atoms. A heteroarylene group refers to a divalent, aromatic carbocyclic system including at least one hetero atom selected from N, O, P, and S as a ring-forming atom, and carbon atoms as the remaining ring-forming atoms. Non-limiting examples of the heteroaryl group include a pyridinyl group, a pyrimidinyl group, a pyrazinyl group, a pyridazinyl group, a triazinyl group, a quinolinyl group, and an isoquinolinyl group. When the heteroaryl group and/or the heteroarylene group include at least two rings, the respective at least two rings may be fused to each other.

As used herein, an aryloxy group refers to a monovalent group represented by —OA$_{102}$ (where A$_{102}$ is the aryl group), and an arylthio group refers to a monovalent group represented by —SA$_{103}$ (where A$_{103}$ is the aryl group).

As used herein, a monovalent non-aromatic condensed polycyclic group refers to a monovalent group that includes at least two rings fused to each other, but that does not have overall aromaticity. The monovalent non-aromatic condensed polycyclic group may include i) only carbon atoms (C), or ii) at least one hetero atom selected from N, O, P, and S as a ring-forming atom, and carbon atoms as the remaining ring-forming atoms. Non-limiting examples of the non-aromatic condensed polycyclic group include a heptalenyl group, a fluorenyl group, a carbazolyl group, and a triquinacenyl group. As used herein, a divalent non-aromatic condensed polycyclic group refers to a divalent group having the same structure as the monovalent non-aromatic condensed polycyclic group.

As used herein, C$_m$-C$_n$ (where m<n) indicate that the number of carbon atoms in a given group that ranges from m to n. For example, a C$_1$-C$_{10}$ alkyl group refers to an alkyl group including 1 to 10 carbon atoms, and a C$_6$-C$_{30}$ aryl group refers to an aryl group including 6 to 30 carbon atoms.

Example 1

A corning 15 Ω/cm$^3$ (1,200 Å) ITO glass substrate was cleaned by sonication with isopropyl alcohol and pure water, and then by irradiation of ultraviolet rays with ozone for 30 minutes. Then, m-MTDATA was vacuum-deposited on the ITO glass substrate to form an HIL having a thickness of 600 Å, and then NPB was vacuum-deposited on the HIL to form a HTL having a thickness of 200 Å. Compound 1 was vacuum-deposited on the HTL to form an auxiliary emission layer having a thickness of about 100 Å. 95 wt % of ADN as a host and 5 wt % of Compound A as a blue dopant were deposited on the auxiliary emission layer to form an EML having a thickness of 300 Å. ET1 was vacuum-deposited on the EML to form an ETL having a thickness of 300 Å. LiF was vacuum-deposited on the ETL to form an EIL having a thickness of 10 Å, and Al was vacuum-deposited on the EIL to form a cathode having a thickness of 1,000 Å, thereby manufacturing an organic light-emitting device.

m-MTDATA

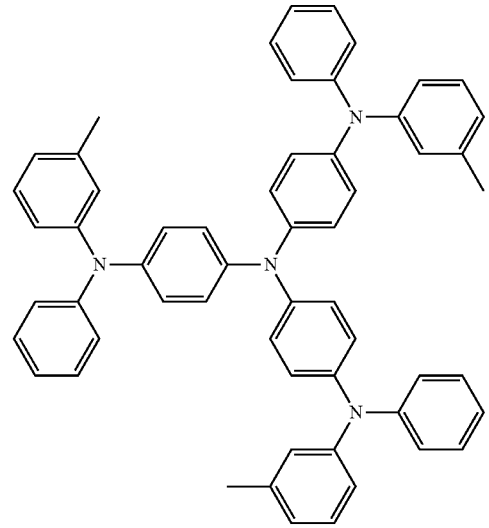

NPB

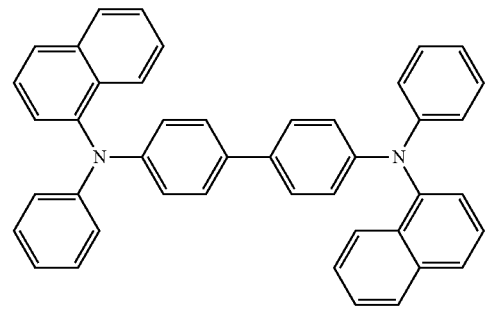

ADN

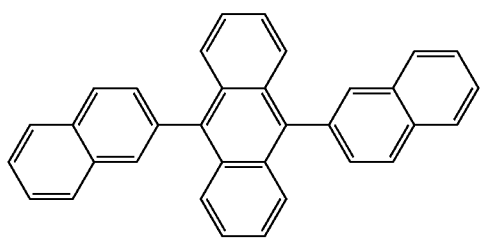

A

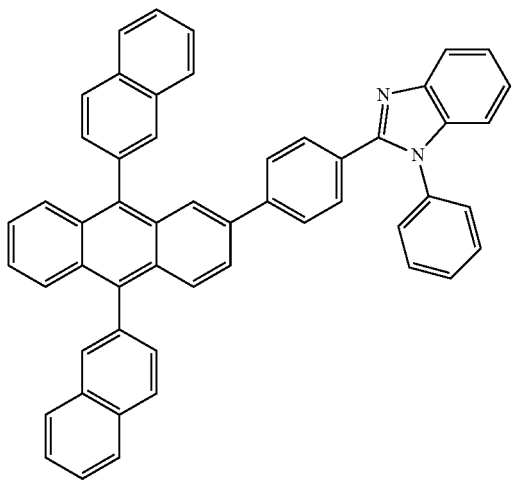

ET1

Example 2

An organic light-emitting device was manufactured as in Example 1, except that Compound 6 instead of Compound 1 was included to form the auxiliary emission layer.

Example 3

An organic light-emitting device was manufactured as in Example 1, except that Compound 7 instead of Compound 1 was included to form the auxiliary emission layer.

Example 4

An organic light-emitting device was manufactured as in Example 1, except that Compound 11 instead of Compound 1 was included to form the auxiliary emission layer.

Example 5

An organic light-emitting device was manufactured as in Example 1, except that Compound 12 instead of Compound 1 was included to form the auxiliary emission layer.

Example 6

An organic light-emitting device was manufactured as in Example 1, except that Compound 16 instead of Compound 1 was included to form the auxiliary emission layer.

Example 7

An organic light-emitting device was manufactured as in Example 1, except that Compound 17 instead of Compound 1 was included to form the auxiliary emission layer.

Comparative Example

An organic light-emitting device was manufactured as in Example 1, except that NPB instead of Compound 1 was included to form the auxiliary emission layer.

Data Measurement

The driving voltages, current efficiencies, and lifetimes of the organic light-emitting devices of Examples 1 to 7 and Comparative Example were measured and the results are shown in Table 1. The lifetimes of the organic light-emitting devices of Examples 1 to 7 are represented as relative to the organic light-emitting device of Comparative Example.

TABLE 1

| Example | Auxiliary emission layer | Driving voltage [V] | Current efficiency [cd/A] | Lifetime (relative level) |
|---|---|---|---|---|
| Example 1 | Compound 1 | 4.1 | 1.2 | 1.1 |
| Example 2 | Compound 6 | 3.9 | 1.15 | 1.1 |
| Example 3 | Compound 7 | 3.8 | 1.2 | 1.05 |
| Example 4 | Compound 11 | 4.0 | 1.3 | 1.1 |
| Example 5 | Compound 12 | 3.9 | 1.3 | 1.2 |
| Example 6 | Compound 16 | 4.0 | 1.15 | 1 |
| Example 7 | Compound 17 | 4.05 | 1.2 | 1.3 |
| Comparative Example | NPB | 4.0 | 1 | 1 |

As can be seen from the data of Table 1, the organic light-emitting devices of Examples 1 to 7 had improved current efficiencies and improved lifetimes as compared to those of the organic light-emitting device of Comparative Example.

According to the one or more of the above embodiments of the present disclosure, an organic light-emitting device may include a hole transport region including the first compound of Formula 1 and the second compound of Formula 2, and as a result, may have improved efficiency and lifetime characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:
a first electrode;
a second electrode;
an emission layer between the first electrode and the second electrode;

a hole transport region between the first electrode and the emission layer; and an electron transport region between the second electrode and the emission layer, wherein the hole transport region comprises a first compound represented by Formula 1:

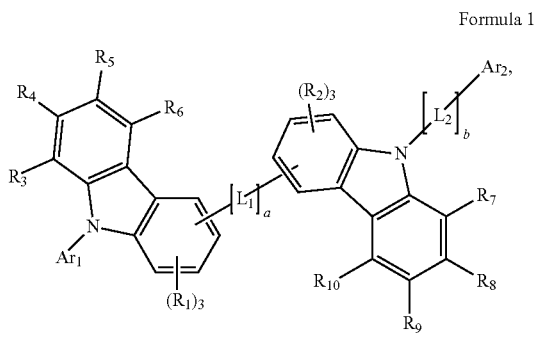

Formula 1 wherein $L_1$ and $L_2$ are each independently selected from a substituted or unsubstituted $C_6$-$C_{40}$ arylene group, or a substituted or unsubstituted $C_2$-$C_{40}$ heteroarylene group, a is 1, b is 0 or 1, $Ar_1$ and $Ar_2$ are each independently selected from a substituted or unsubstituted $C_6$-$C_{40}$ aryl group, or a substituted or unsubstituted $C_1$-$C_{40}$ heteroaryl group, a plurality of $R_1$s, a plurality of $R_2$s, and $R_3$ to $R_{10}$ are each independently selected from a hydrogen, a deuterium, a halogen atom, a hydroxyl group, a cyano group, an amino group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{40}$ aryl group, a substituted or unsubstituted $C_2$-$C_{40}$ heteroaryl group, a substituted or unsubstituted $C_6$-$C_{40}$ aryloxy group, a substituted or unsubstituted $C_6$-$C_{40}$ arylthio group, a monovalent $C_6$-$C_{40}$ non-aromatic condensed polycyclic group, —Si($Q_1$)($Q_2$)($Q_3$), and —B($Q_4$)($Q_5$), wherein at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_3$-$C_{10}$ cycloalkenyl group, the substituted $C_3$-$C_{10}$ heterocycloalkyl group, the substituted $C_3$-$C_{10}$ heterocycloalkenyl group, the substituted $C_6$-$C_{40}$ aryl group, the substituted $C_1$-$C_{40}$ heteroaryl group, the substituted $C_6$-$C_{40}$ aryloxy group, the substituted $C_6$-$C_{40}$ arylthio group, the substituted $C_6$-$C_{40}$ arylene group, and the substituted $C_2$-$C_{40}$ heteroarylene group is selected from:

a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from a deuterium, a halogen atom, a hydroxyl group, a cyano group, an amino group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, each substituted with at least one selected from a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{21}$)($Q_{22}$), —Si($Q_{23}$)($Q_{24}$)($Q_{25}$), and —B($Q_{26}$)($Q_{27}$), and —Si($Q_{31}$)($Q_{32}$)($Q_{33}$), and —B($Q_{34}$)($Q_{35}$), wherein $Q_1$ to $Q_5$, $Q_{11}$ to $Q_{17}$, $Q_{21}$ to $Q_{27}$, and $Q_{31}$ to $Q_{35}$ are each independently selected from a hydrogen, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, and a monovalent $C_6$-$C_{40}$ non-aromatic condensed polycyclic group; and optionally, $R_7$ and $R_8$, $R_8$ and $R_9$, and/or $R_9$ and $R_{10}$ are each independently bound to each other to form a condensed ring.

2. The organic light-emitting device of claim 1, wherein the hole transport region comprises an auxiliary emission layer, and the auxiliary emission layer comprises the first compound represented by Formula 1.

3. The organic light-emitting device of claim 2, wherein the hole transport region further comprises at least one of a hole transport layer, a hole injection layer, and a hole injection transport layer.

4. The organic light-emitting device of claim 1, wherein the electron transport region comprises at least one of a hole blocking layer, an electron transport layer, an electron injection layer, and an electron injection transport layer.

5. The organic light-emitting device of claim 1, wherein $L_1$ and $L_2$ are each independently selected from a phenylene group, a pentalenylene group, an indenylene group, a naphthylene group, an azulenylene group, an indacenylene group, an acenaphthylene group, a heptalenylene group, a phenalenylene group, a fluorenylene group, a phenanthrenylene group, an anthrylene group, a fluoranthenylene group, a pyrenylene group, a naphthacenylene group, a chrysenylene group, a triphenylenylene group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, and a phenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, a triphenylenyl group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, each substituted with at least one selected from a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_5$-$C_{40}$ aryl group, a $C_2$-$C_{40}$ heteroaryl group, a $C_5$-$C_{40}$ aryloxy group, and a $C_5$-$C_{40}$ arylthio group.

6. The organic light-emitting device of claim 1, wherein $L_1$ to $L_2$ are each independently selected from:

a phenylene group, a pyridylene group, a naphthylene group, a triphenylenylene group, and a phenylene group, a pyridylene group, a naphthylene group, and a triphenylenylene group, each substituted with at least one halogen atom.

7. The organic light-emitting device of claim 1, wherein $L_1$ to $L_2$ are each independently selected from Formulae 2A to 2E:

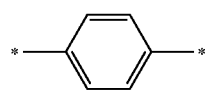
2A

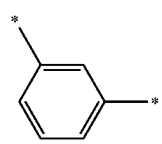
2B

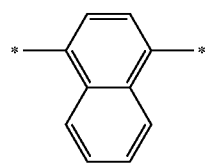
2C

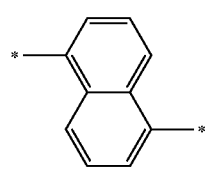
2D

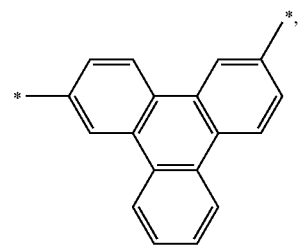
2E wherein * indicates a binding site to a neighboring atom.

8. The organic light-emitting device of claim 1, wherein $Ar_1$ and $Ar_2$ are each independently selected from:

a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, a benzocarbazolyl group, and a dibenzacridinyl group, and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, and a benzocarbazolyl group, each substituted with at least one selected from a deuterium, a halogen atom, a hydroxyl group, a cyano group, an amino group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_4$-$C_{30}$ heteroaryl group, a $C_5$-$C_{30}$ aryloxy group, and a $C_6$-$C_{30}$ arylthio group.

9. The organic light-emitting device of claim 1, wherein $Ar_1$ and $Ar_2$ are each independently selected from:
a phenyl group, a naphthyl group, a pyridyl group, a triphenylenyl group, a phenanthrenyl group, an anthryl group, a naphthyl group, an isoquinolyl group, and a benzimidazolyl group, and
a phenyl group, a naphthyl group, a pyridyl group, a triphenylenyl group, a phenanthrenyl group, an anthryl group, a naphthyl group, an isoquinolyl group, and a benzimidazolyl group, each substituted with at least one selected from a deuterium, a halogen atom, a hydroxyl group, a cyano group, an amino group, a $C_1$-$C_{10}$ alkyl group, a $C_1$-$C_{10}$ alkoxy group, a $C_6$-$C_{30}$ aryl group, a $C_4$-$C_{30}$ heteroaryl group, and a $C_5$-$C_{30}$ aryloxy group.

10. The organic light-emitting device of claim 1, wherein $Ar_1$ and $Ar_2$ are each independently selected from Formulae 3A to 3E:

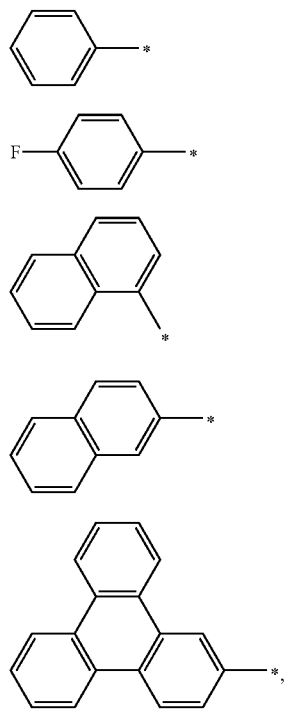

wherein * indicates a binding site to a neighboring atom.

11. The organic light-emitting device of claim 1, wherein the plurality of $R_1$s, the plurality of $R_2$s, and $R_3$ to $R_{10}$ are each independently selected from:

a hydrogen, a deuterium, a halogen atom, a hydroxyl group, a cyano group, an amino group, a methyl group, an ethyl group, a propyl group, a butyl group, a pentyl group, a hexyl group, a cyclopropyl group, a cyclobutyl group, a cyclopentyl group, a cyclohexyl group, a cycloheptyl group, a cyclooctyl group, a phenyl group, a naphthyl group, a pentalenyl group, a pyrenyl group, an indenyl group, an azulenyl group, an anthryl group, a phenalenyl group, a phenanthrenyl group, a perylenyl group, a fluoranthenyl group, a naphthacenyl group, a fluorenyl group, a pyridyl group, a pyrimidinyl group, a quinolyl group, an isoquinolyl group, a pyrazinyl group, a pyridazinyl group, a triazinyl group, a carbazolyl group, a phenoxazinyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a dibenzofuranyl group, and a dibenzothiophenyl group,
a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, each substituted with at least one selected from a deuterium, a halogen atom, a hydroxyl group, a cyano group, and an amino group; and
a phenyl group, a naphthyl group, a pentalenyl group, a pyrenyl group, an indenyl group, an azulenyl group, an anthryl group, a phenalenyl group, a phenanthrenyl group, a perylenyl group, a fluoranthenyl group, a naphthacenyl group, a fluorenyl group, a pyridyl group, a pyrimidinyl group, a quinolyl group, an isoquinolyl group, a pyrazinyl group, a pyridazinyl group, a triazinyl group, a carbazolyl group, a phenoxazinyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a dibenzofuranyl group, and a dibenzothiophenyl group, each substituted with at least one selected from:
a hydrogen, a deuterium, a halogen atom, a hydroxyl group, a cyano group, an amino group, a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, and
a methyl group, an ethyl group, a propyl group, a butyl group, a pentyl group, a hexyl group, a cyclopropyl group, a cyclobutyl group, a cyclopentyl group, a cyclohexyl group, a cycloheptyl group, and a cyclooctyl group, each substituted with a deuterium or a halogen atom.

12. The organic light-emitting device of claim 1, wherein the plurality of $R_1$s, the plurality of $R_2$s, and $R_3$ to $R_{10}$ are each independently selected from a hydrogen, a deuterium, a halogen atom, a hydroxyl group, a cyano group, an amino group, a methyl group, a phenyl group, a naphthyl group, an anthryl group, a triphenylenyl group, a pyridyl group, a quinolyl group, and an isoquinolyl group, and
optionally, $R_7$ and $R_8$, $R_8$ and $R_9$, and/or $R_9$ and $R_{10}$ are each independently bound to each other to form a benzene ring.

13. An organic light-emitting device comprising:
a first electrode;
a second electrode;
an emission layer between the first electrode and the second electrode;
a hole transport region between the first electrode and the emission layer; and an electron transport region between the second electrode and the emission layer, wherein the hole transport region comprises a first compound represented by Formula 1:

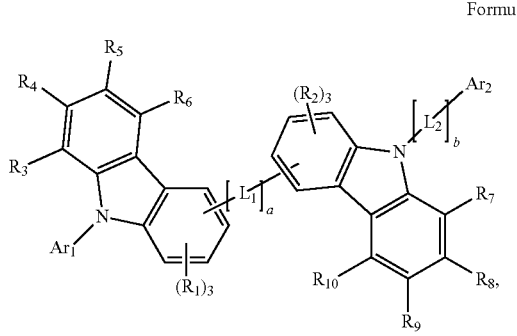

Formula 1 wherein $L_1$ and $L_2$ are each independently selected from a substituted or unsubstituted $C_6$-$C_{40}$ arylene group, or a substituted or unsubstituted $C_2$-$C_{40}$ heteroarylene group, a and b are each independently 0 or 1, $Ar_1$ and $Ar_2$ are each independently selected from a substituted or unsubstituted $C_6$-$C_{40}$ aryl group, or a substituted or unsubstituted $C_1$-$C_{40}$ heteroaryl group, a plurality of $R_1$s, a plurality of $R_2$s and $R_3$ to $R_{10}$ are each independently selected from a hydrogen, a deuterium, a halogen atom, a hydroxyl group, a cyano group, an amino group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{40}$ aryl group, a substituted or unsubstituted $C_2$-$C_{40}$ heteroaryl group, a substituted or unsubstituted $C_6$-$C_{40}$ aryloxy group, a substituted or unsubstituted $C_6$-$C_{40}$ arylthio group, a monovalent $C_6$-$C_{40}$ non-aromatic condensed polycyclic group, —Si($Q_1$)($Q_2$)($Q_3$), and —B($Q_4$)($Q_5$), wherein at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_3$-$C_{10}$ cycloalkenyl group, the substituted $C_3$-$C_{10}$ heterocycloalkyl group, the substituted $C_3$-$C_{10}$ heterocycloalkenyl group, the substituted $C_6$-$C_{40}$ aryl group, the substituted $C_1$-$C_{40}$ heteroaryl group, the substituted $C_6$-$C_{40}$ aryloxy group, the substituted $C_6$-$C_{40}$ arylthio group, the substituted $C_6$-$C_{40}$ arylene group, and the substituted $C_2$-$C_{40}$ heteroarylene group is selected from:

a deuterium, a halogen atom, a hydroxyl group, a cyano group, an amino group, a $C_{1-20}$ alkyl group, a $C_2$-$C_{20}$ alkenyl group, a $C_2$-$C_{20}$ alkynyl group, and a $C_1$-$C_{20}$ alkoxy group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from a deuterium, a halogen atom, a hydroxyl group, a cyano group, an amino group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_{6-40}$ arylthio group, and a monovalent $C_6$-$C_{40}$ non-aromatic condensed polycyclic group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, and a monovalent $C_6$-$C_{40}$ non-aromatic condensed polycyclic group, each substituted with at least one selected from a deuterium, a halogen atom, a hydroxyl group, a cyano group, an amino group, a alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, a $C_6$-$C_{40}$ arylthio group, a monovalent $C_6$-$C_{40}$ non-aromatic condensed polycyclic group, —N($Q_{21}$)($Q_{22}$), —Si($Q_{23}$)($Q_{24}$)($Q_{25}$), and —B($Q_{26}$)($Q_{27}$), and —Si($Q_{31}$)($Q_{32}$)($Q_{33}$), and —B($Q_{34}$)($Q_{35}$), wherein $Q_1$ to $Q_5$, $Q_{11}$ to $Q_{17}$, $Q_{21}$ to $Q_{27}$ and $Q_{31}$ to $Q_{35}$ are each independently selected from a hydrogen, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, and a monovalent $C_6$-$C_{40}$ non-aromatic condensed polycyclic group;

optionally, $R_7$ and $R_8$, $R_8$ and $R_9$, and/or $R_9$ and $R_{10}$ are each independently bound to each other to form a condensed ring, wherein the hole transport region further comprises a second compound represented by Formula 2:

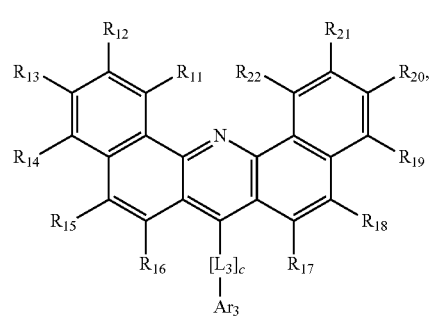

Formula 2 wherein $L_3$ is a substituted or unsubstituted $C_6$-$C_{30}$ arylene group, or a substituted or unsubstituted $C_5$-$C_{30}$ heteroarylene group;

c is 0 or 1;

$Ar_3$ is a substituted or unsubstituted $C_6$-$C_{30}$ aryl group or a substituted or unsubstituted $C_5$-$C_{30}$ heteroaryl group; and $R_{11}$ to $R_{22}$ are defined as $R_1$ to $R_{10}$ in Formula 1.

14. The organic light-emitting device of claim 13, wherein
L₃ is a phenyl group;
  c is 0 or 1;
  Ar₃ is selected from:
    a pyridyl group, a naphthyl group, an anthryl group, a quinolyl group, an isoquinolyl group, and a benzodiazolyl group, and
    a pyridyl group, a quinolyl group, an isoquinolyl group, and a benzodiazolyl group, each substituted with a phenyl group or a naphthyl group; and
  $R_{11}$ to $R_{22}$ are each a hydrogen.

15. The organic light-emitting device of claim 13, wherein
L₃ is a phenyl group;
  c is 0 or 1;
  Ar₃ is selected from Formulae 4A to 4F:

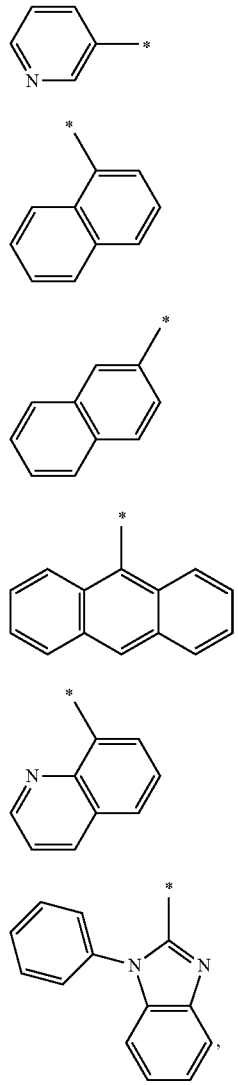

wherein * indicates a binding site to a neighboring atom; and
  $R_{11}$ to $R_{22}$ are hydrogens.

16. The organic light-emitting device of claim 13, wherein a weight ratio of the first compound to the second compound is about 20:80 to about 80:20.

17. The organic light-emitting device of claim 13, wherein the second compound represented by Formula 2 comprises at least one of Compounds 21 to 26:

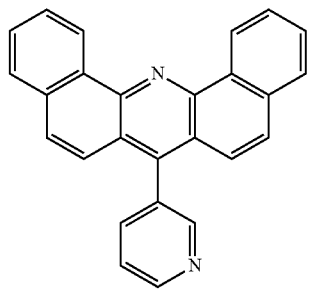

21

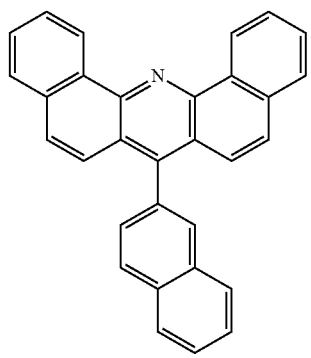

22

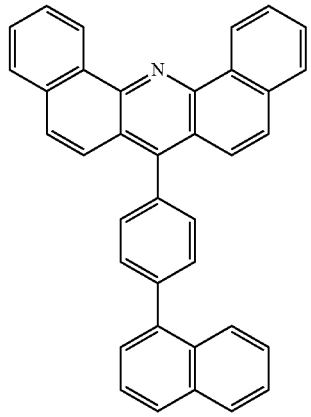

23

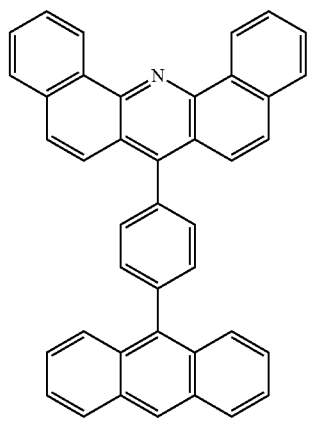

24

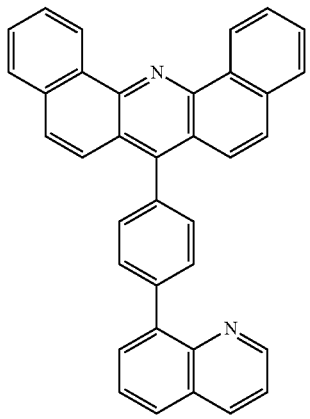
25
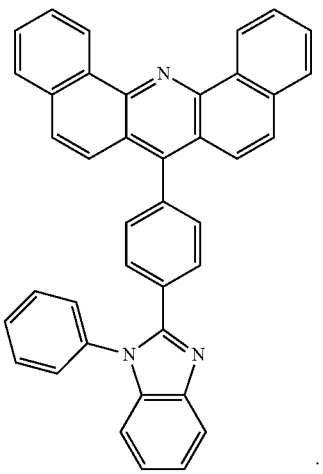
26
18. The organic light-emitting device of claim 1, wherein the first compound represented by Formula 1 comprises at least one of Compounds 1 to 18:
1
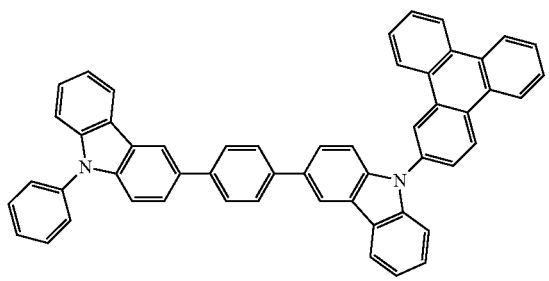
2
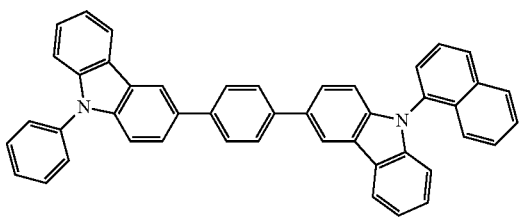
3
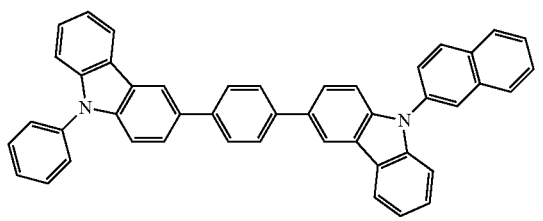
4
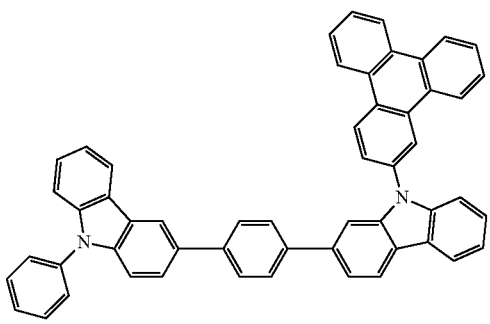
5
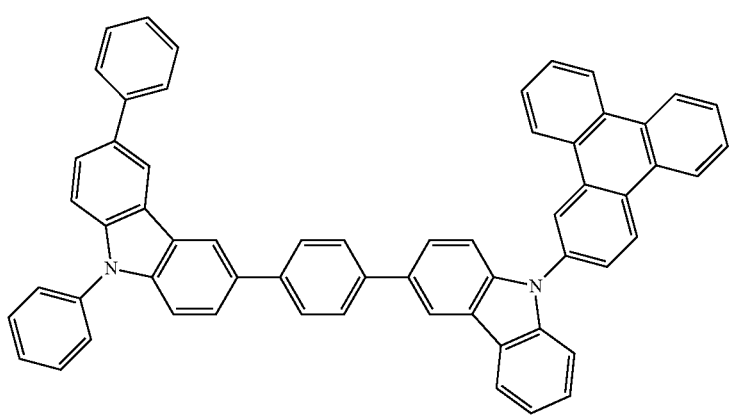

6
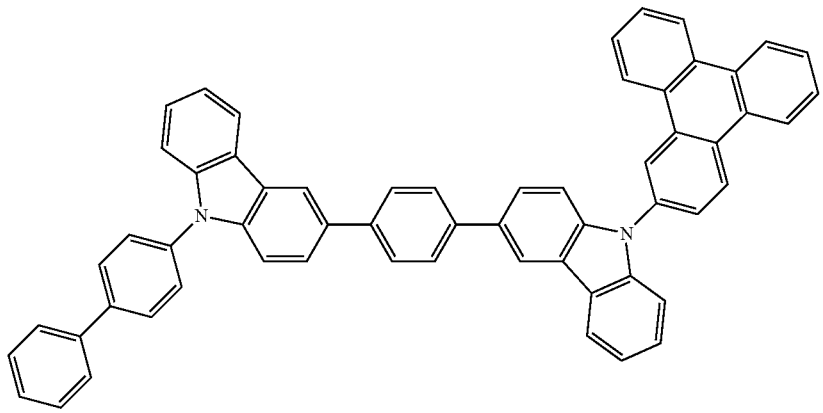
7
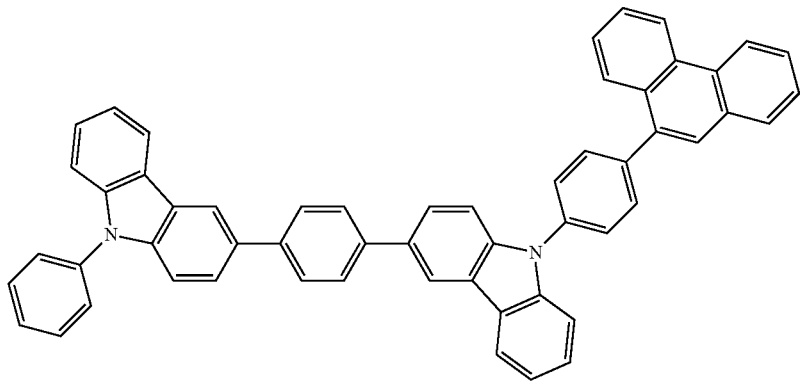
8
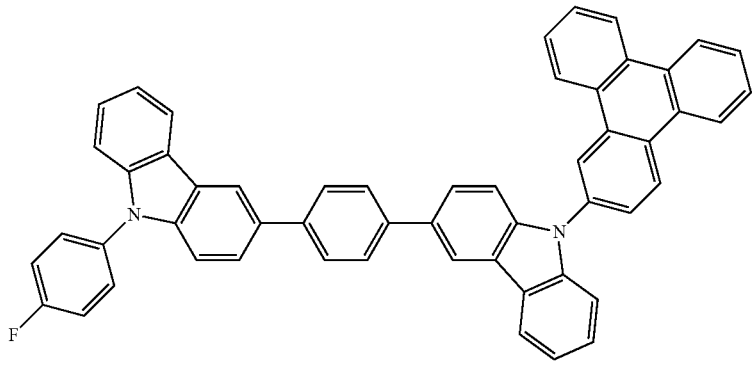
9
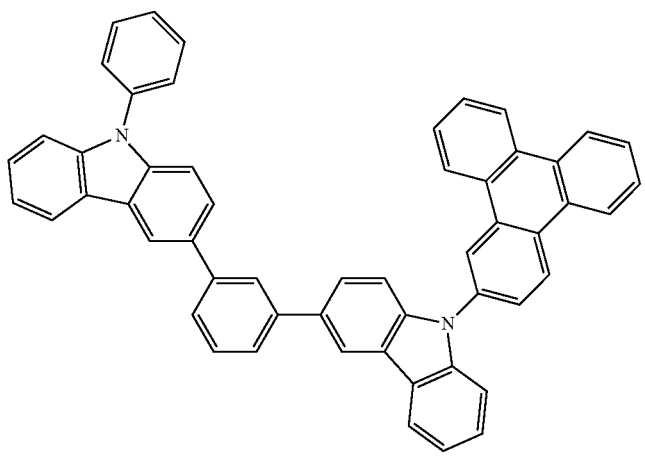

-continued
10
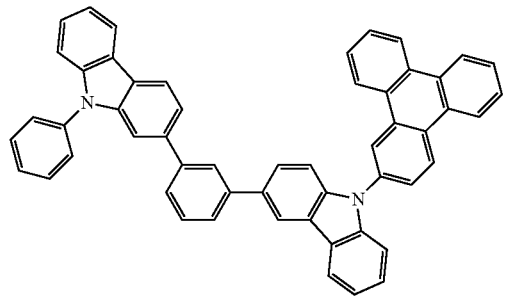
11
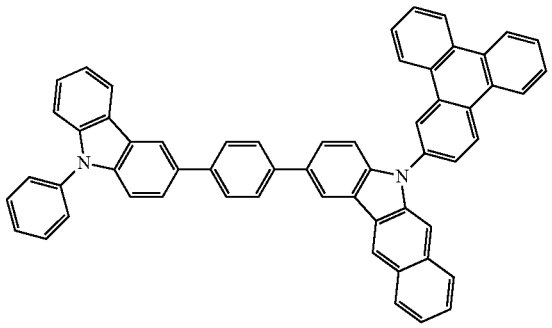
12
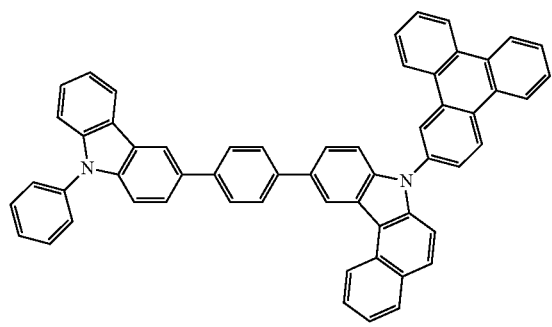
13
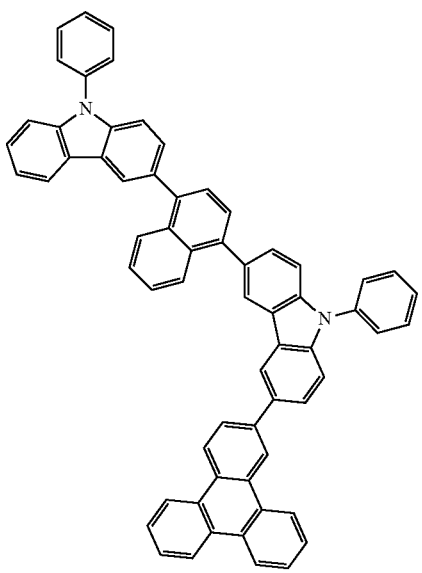
14
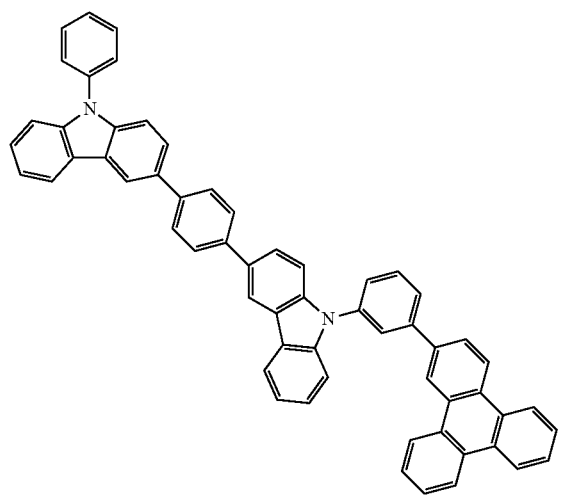
15
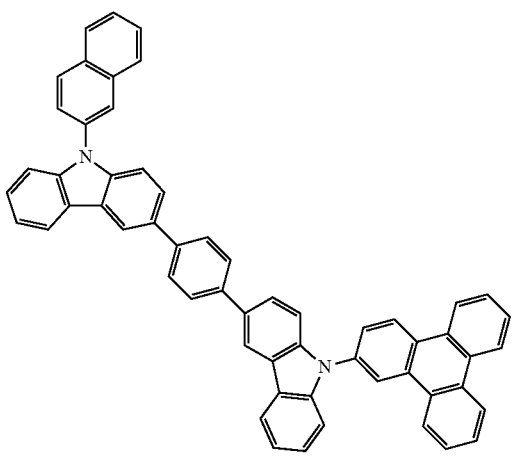

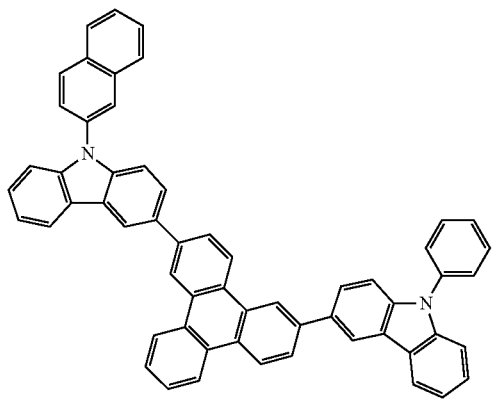

16

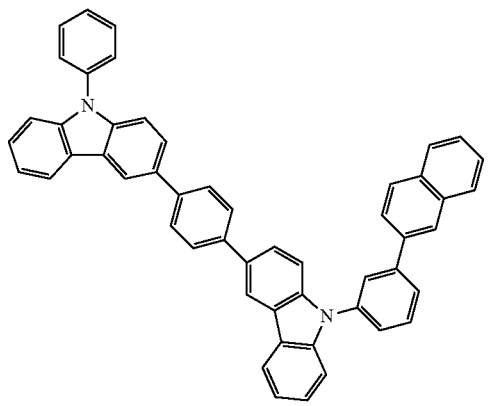

17

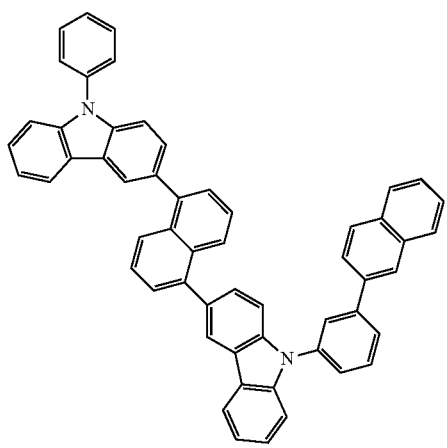

35

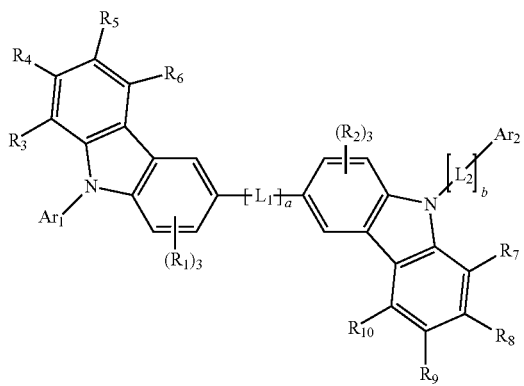

19. An organic light-emitting device comprising:
a first electrode;
a second electrode;
an emission layer between the first electrode and the second electrode;
a hole transport region between the first electrode and the emission layer; and
an electron transport region between the second electrode and the emission layer,
wherein the hole transport region comprises a first compound represented by one of Formulae 1A to 1C:

Formula 1A

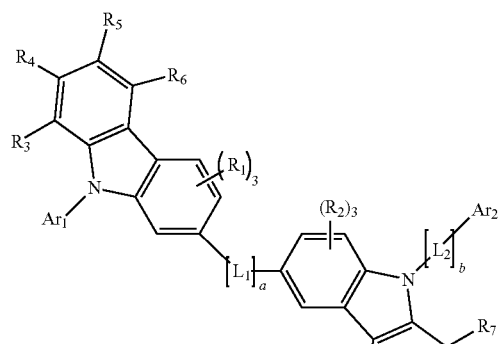

Formula 1B

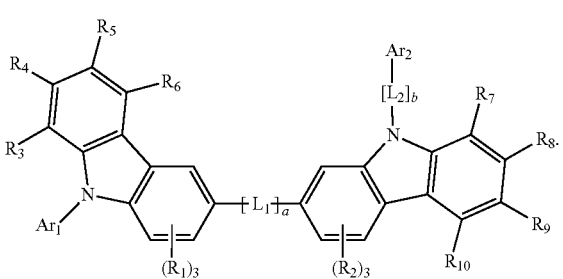

Formula 1C wherein
L₁ and L₂ are each independently selected from a phenylene group, a pyridylene group, and a phenylene group substituted with at least one halogen atom;
a is 1,
b is 0 or 1,
Ar₁ and Ar₂ are each independently selected from:
a phenyl group, a naphthyl group, a pyridyl group, a triphenylenyl group, a phenanthrenyl group, an anthryl group, a naphthyl group, an isoquinolyl group, and a benzimidazolyl group, and
a phenyl group, a naphthyl group, a pyridyl group, a triphenylenyl group, a phenanthrenyl group, an anthryl group, a naphthyl group, an isoquinolyl group, and a benzimidazolyl group, each substituted with at least one selected from a deuterium, a halogen atom, a hydroxyl group, a cyano group, an amino group, a $C_1$-$C_{20}$ alkyl group, a $C_1$-$C_{20}$ alkoxy group, a $C_6$-$C_{40}$ aryl group, a $C_2$-$C_{40}$ heteroaryl group, and a $C_5$-$C_{40}$ aryloxy group;
a plurality of $R_1$s, a plurality of $R_2$s, and $R_3$ to $R_{10}$ are each independently selected from a hydrogen, a deuterium, a halogen atom, a hydroxyl group, a cyano group, an amino group, a methyl group, a phenyl group, a naphthyl group, an anthryl group, a triphenylenyl group, a pyridyl group, a quinolyl group, and an isoquinolyl group; and
optionally, $R_7$ and $R_8$, $R_8$ and $R_9$, and/or $R_9$ and $R_{10}$ are each independently bound to each other to form a benzene ring.

20. The organic light-emitting device of claim 19, wherein the hole transport region further comprises a second compound represented by Formula 2A:

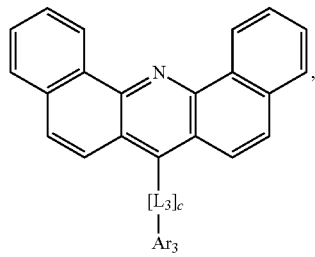

Formula 2A wherein L₃ is a phenyl group;
c is 0 or 1;

Ar₃ is selected from Formulae 4A to 4F:

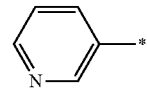
4A

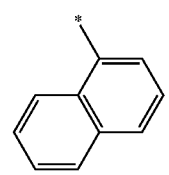
4B

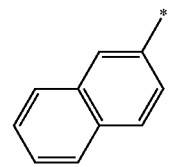
4C

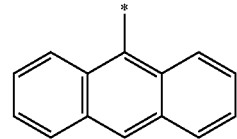
4D

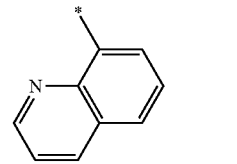
4E

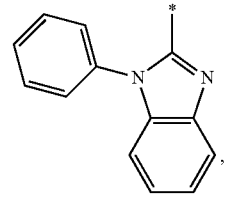
4F and
wherein * indicates a binding site to a neighboring atom.

* * * * *